(12) United States Patent
Fukushima et al.

(10) Patent No.: US 10,367,000 B2
(45) Date of Patent: Jul. 30, 2019

(54) SEMICONDUCTOR DEVICE AND METHOD FOR MANUFACTURING SAME

(71) Applicant: Toshiba Memory Corporation, Minato-ku (JP)

(72) Inventors: Takashi Fukushima, Yokkaichi (JP); Katsuyuki Sekine, Yokkaichi (JP); Satoshi Nagashima, Yokkaichi (JP); Hisataka Meguro, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/699,728

(22) Filed: Sep. 8, 2017

(65) Prior Publication Data
US 2018/0277555 A1  Sep. 27, 2018

(30) Foreign Application Priority Data
Mar. 23, 2017 (JP) ................. 2017-058026

(51) Int. Cl.
| | |
|---|---|
| *H01L 21/311* | (2006.01) |
| *H01L 21/768* | (2006.01) |
| *H01L 23/532* | (2006.01) |
| *H01L 21/3105* | (2006.01) |
| *H01L 27/1157* | (2017.01) |
| *H01L 27/11556* | (2017.01) |
| *H01L 27/11582* | (2017.01) |

(52) U.S. Cl.
CPC .... *H01L 27/11556* (2013.01); *H01L 21/7682* (2013.01); *H01L 21/76831* (2013.01); *H01L 21/76834* (2013.01); *H01L 23/5329* (2013.01); *H01L 27/1157* (2013.01); *H01L 27/11582* (2013.01); *H01L 21/31053* (2013.01); *H01L 21/31111* (2013.01); *H01L 21/31116* (2013.01)

(58) Field of Classification Search
CPC ................................. H01L 27/11556
See application file for complete search history.

(56) References Cited

U.S. PATENT DOCUMENTS

| | | | |
|---|---|---|---|
| 7,847,334 B2 | 12/2010 | Katsumata et al. | |
| 8,338,876 B2 | 12/2012 | Kito et al. | |
| 8,445,347 B2 | 5/2013 | Alsmeier | |
| 8,581,330 B2 | 11/2013 | Kiyotoshi | |

(Continued)

FOREIGN PATENT DOCUMENTS

| | | |
|---|---|---|
| JP | 2009-224465 | 10/2009 |
| JP | 2010-147125 | 7/2010 |

(Continued)

*Primary Examiner* — William A Harriston
(74) *Attorney, Agent, or Firm* — Oblon, McClelland, Maier & Neustadt, L.L.P.

(57) ABSTRACT

According to one embodiment, a semiconductor device includes a foundation layer, a stacked body provided above the foundation layer, a semiconductor body, and a charge storage portion. The stacked body includes a plurality of electrode layers stacked with an air gap interposed, a plurality of select gate layers stacked in a stacking direction of the electrode layers, and an insulating body provided between the select gate layers adjacent to each other in the stacking direction. The semiconductor body extends in the stacking direction in the stacked body. The charge storage portion is provided between the semiconductor body and one of the electrode layers.

16 Claims, 35 Drawing Sheets

(56) References Cited

U.S. PATENT DOCUMENTS

| | | | |
|---|---|---|---|
| 8,779,499 | B2 | 7/2014 | Kiyotoshi |
| 8,822,322 | B2 | 9/2014 | Lee et al. |
| 8,847,302 | B2 | 9/2014 | Alsmeier et al. |
| 8,916,921 | B2 | 12/2014 | Tanaka et al. |
| 9,406,693 | B1 * | 8/2016 | Pang ................. H01L 27/11582 |
| 2010/0207193 | A1 * | 8/2010 | Tanaka .............. H01L 27/11578 |
| | | | 257/324 |
| 2011/0033995 | A1 | 2/2011 | Katsumata et al. |
| 2015/0380431 | A1 | 12/2015 | Kanamori et al. |
| 2017/0053933 | A1 | 2/2017 | Kamigaichi |

FOREIGN PATENT DOCUMENTS

| | | |
|---|---|---|
| JP | 2010-192517 | 9/2010 |
| JP | 2012-227326 | 11/2012 |
| JP | 2013-38124 | 2/2013 |
| TW | 201709294 A | 3/2017 |
| TW | I575522 B | 3/2017 |

\* cited by examiner

| CAP LAYER 43 | COVER FILM 61 | SIDE WALL FILM 62 | INSULATING LAYER 72 | SEALING FILM 44 |
|---|---|---|---|---|
| $SiO_2/HfO_2/HfSiON$ | POLYSILAZANE | LTO | THERMAL SiN | PLASMA OXIDE FILM |
| $SiO_2/HfO_2/HfSiON$ | POLYSILAZANE | LTO | BSG/PSG | PLASMA OXIDE FILM |
| $SiO_2/HfO_2/HfSiON$ | SPIN ON CARBON | LTO | THERMAL SiN | PLASMA OXIDE FILM |
| $SiO_2/Al_2O_3/SiN$ | SPIN ON CARBON | LTO | BSG/PSG | PLASMA OXIDE FILM |
| $SiN/SiO_2/Al_2O_3$ | SPIN ON CARBON | PLASMA SiN | BSG/PSG | PLASMA OXIDE FILM |
| SiN/SiC/SiCO | SPIN ON CARBON | PLASMA SiN/SiC/SiCO | $SiO_2$ | PLASMA OXIDE FILM |
| $SiO_2/HfO_2/HfSiON$ | AMORPHOUS Si | LTO | THERMAL SiN | PLASMA OXIDE FILM |
| $SiO_2/HfO_2/HfSiON/SiN/Al_2O_3$ | AMORPHOUS Si | LTO | BSG/PSG | PLASMA OXIDE FILM |
| $SiO_2/HfO_2/HfSiON/SiN/Al_2O_3$ | AMORPHOUS Si | PLASMA SiN | BSG/PSG | PLASMA OXIDE FILM |
| SiN/SiC/SiCO | AMORPHOUS Si | PLASMA SiN/SiC/SiCO | $SiO_2$ | PLASMA OXIDE FILM |
| $SiO_2/HfO_2/HfSiON$ | CARBON-BASED FILM | LTO | THERMAL SiN | PLASMA OXIDE FILM |
| $SiO_2/HfO_2/HfSiON/Al_2O_3$ | CARBON-BASED FILM | LTO | BSG/PSG | PLASMA OXIDE FILM |
| $SiO_2/HfO_2/HfSiON/SiN/Al_2O_3$ | CARBON-BASED FILM | PLASMA SiN | BSG/PSG | PLASMA OXIDE FILM |
| SiN/SiC/SiCO | CARBON-BASED FILM | PLASMA SiN/SiC/SiCO | $SiO_2$ | PLASMA OXIDE FILM |
| $SiO_2/HfO_2/HfSiON$ | BSG/PSG | LTO | THERMAL SiN | PLASMA OXIDE FILM |
| $SiO_2/HfO_2/HfSiON/SiN/Al_2O_3$ | BSG/PSG | LTO | BSG/PSG | PLASMA OXIDE FILM |
| $SiO_2/HfO_2/HfSiON/SiN/Al_2O_3$ | BSG/PSG | PLASMA SiN | BSG/PSG | PLASMA OXIDE FILM |
| SiN/SiC/SiCO | BSG/PSG | PLASMA SiN/SiC/SiCO | $SiO_2$ | PLASMA OXIDE FILM |

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-058026, filed on Mar. 23, 2017; the entire contents of which are incorporated herein by reference.

FIELD

Embodiments described herein relate generally to a semiconductor device and a method for manufacturing a semiconductor device.

BACKGROUND

In a three-dimensional memory device, a structure in which air gap is provided between electrode layers adjacent to each other in a stacking direction has been proposed.

BRIEF DESCRIPTION OF THE DRAWINGS

FIG. 35 is a view showing examples of combination of materials of elements shown in FIG. 4 to FIG. 13.

DETAILED DESCRIPTION

Figure 1:
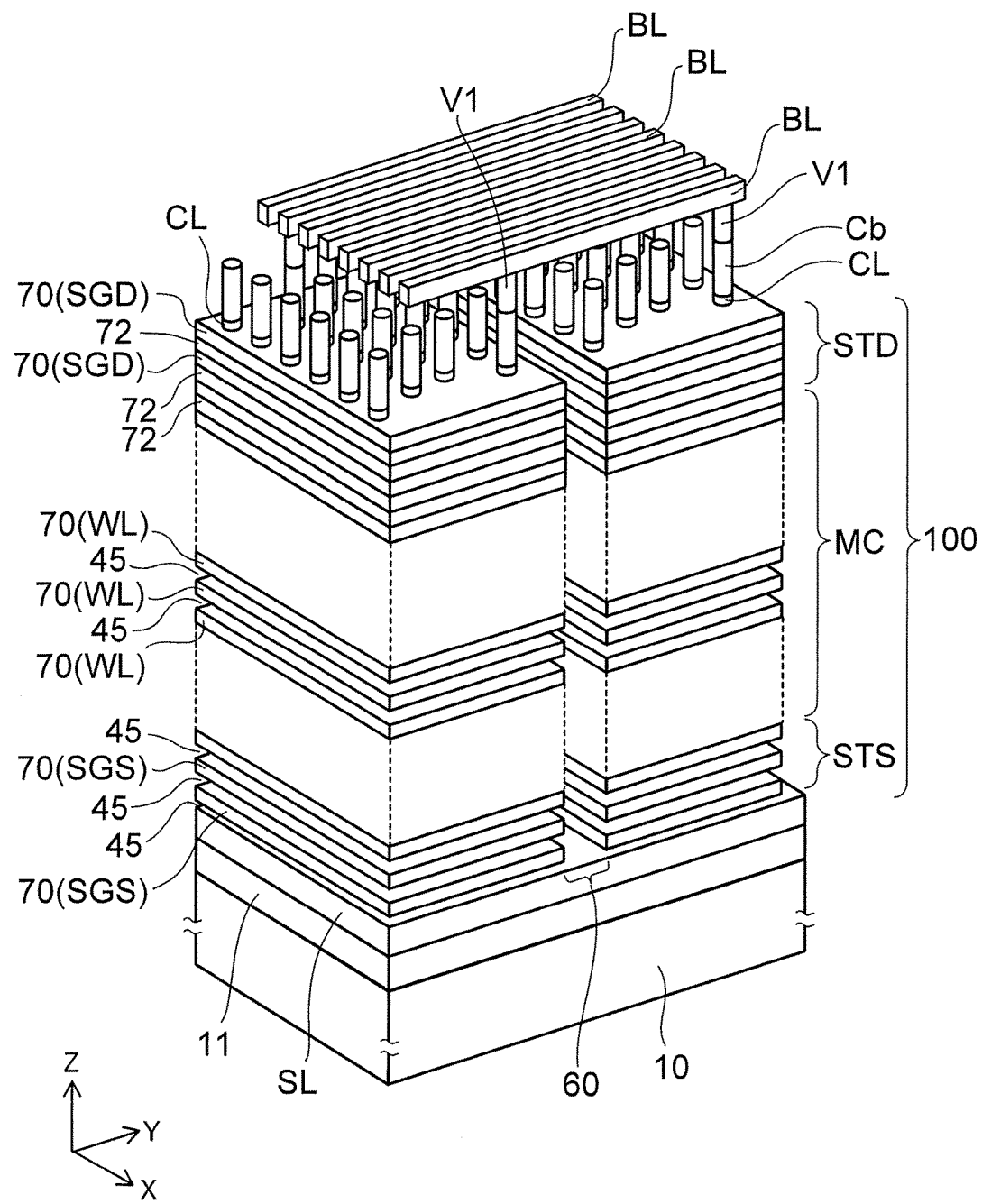
FIG. 1 is a schematic perspective view of a semiconductor device of an embodiment.

According to one embodiment, a semiconductor device includes a foundation layer, a stacked body provided above the foundation layer, a semiconductor body, and a charge storage portion. The stacked body includes a plurality of electrode layers stacked with an air gap interposed, a plurality of select gate layers stacked in a stacking direction of the electrode layers, and an insulating body provided between the select gate layers adjacent to each other in the stacking direction. The semiconductor body extends in the stacking direction in the stacked body. The charge storage portion is provided between the semiconductor body and one of the electrode layers.

Hereinafter, embodiments will be described with reference to the drawings. Incidentally, in the respective drawings, the same components are denoted by the same reference numerals.

In the embodiments, as the semiconductor device, for example, a semiconductor memory device including a memory cell array having a three-dimensional structure will be described.

FIG. 1 is a schematic perspective view of a memory cell array of an embodiment.

Figure 2:
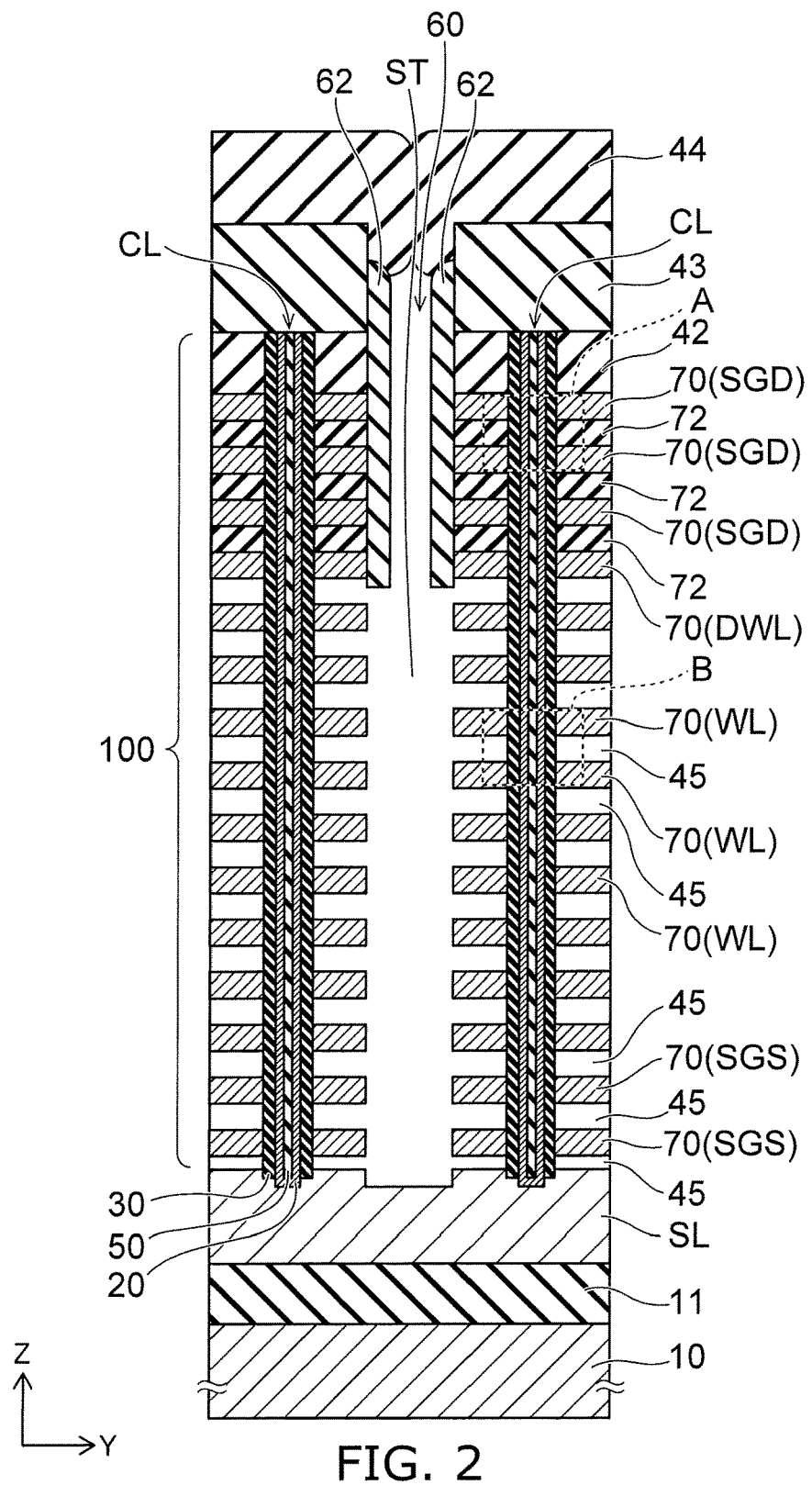
FIG. 2 is a schematic sectional view of the semiconductor device of the embodiment.

FIG. 2 is a schematic sectional view of the memory cell array of the embodiment.

In FIG. 1, two directions that are parallel to a major surface of a substrate 10 and orthogonal to each other are defined as an X-direction and a Y-direction, and a direction that is orthogonal to the X-direction and the Y-direction is defined as a Z-direction (stacking direction). The Y-direction and the Z-direction in FIG. 2 correspond to the Y-direction and the Z-direction in FIG. 1, respectively.

The memory cell array includes a source layer SL, a stacked body 100 provided on the source layer SL, a plurality of columnar portions CL, a plurality of dividing portions 60, and a plurality of bit lines BL provided above the stacked body 100.

The columnar portion CL is formed in a substantially circular columnar shape extending in the stacked body 100 in the stacking direction of the stacked body 100 (Z-direction). The plurality of columnar portions CL is disposed in, for example, a staggered arrangement. Alternatively, the plurality of columnar portions CL may be disposed in a square grid pattern along the X-direction and the Y-direction.

The dividing portion 60 divides the stacked body 100 into a plurality of blocks (or finger portions) in the Y-direction.

The plurality of bit lines BL is, for example, a metal film extending in the Y-direction. The plurality of bit lines BL is separated from each other in the X-direction.

An upper end portion of the below-mentioned semiconductor body 20 of the columnar portion CL is connected to the bit line BL through a contact Cb and a contact V1 shown in FIG. 1.

The source layer SL is provided on the substrate 10 with an insulating layer 11 interposed. The substrate 10 is, for example, a silicon substrate. Further, in the insulating layer 11, an interconnect or a circuit may be provided. The source layer SL includes, for example, a semiconductor layer (semiconductor region) doped with an impurity and a layer containing a metal provided between the semiconductor layer and the insulating layer 11.

As shown in FIG. 2, a lower end portion of the semiconductor body 20 is in contact with the semiconductor layer of the source layer SL as a foundation layer. Alternatively, a lower end portion of the semiconductor body 20 may be in contact with the substrate 10 as a foundation layer without providing the source layer SL between the stacked body 100 and the substrate 10.

The stacked body 100 is provided on the source layer SL. The stacked body 100 includes a plurality of conductive layers 70 stacked in a direction (Z-direction) perpendicular to a major surface of the substrate 10. An insulating layer 42 is provided on the uppermost conductive layer 70.

The respective conductive layers 70 are layers of the same material and having substantially the same thickness. The conductive layer 70 is a layer containing polycrystalline silicon doped with an impurity or a metal as a main component.

Among the plurality of conductive layers 70, at least the uppermost conductive layer 70 is a drain-side select gate (upper-side select gate layer) SGD of a drain-side select transistor STD (FIG. 1), and at least the lowermost conductive layer 70 is a source-side select gate (lower-side select gate layer) SGS of a source-side select transistor STS (FIG. 1).

For example, three layers of the conductive layers 70 on an upper layer side including the uppermost conductive layer 70 are drain-side select gates SGD. Also, a plurality of source-side select gates SGS is provided.

The plurality of conductive layers 70 between the drain-side select gate SGD and the source-side select gate SGS is an electrode layer (word line) WL functioning as a control gate of a memory cell MC (FIG. 1).

At least one layer of the conductive layers 70 between the uppermost electrode layer WL among the plurality of electrode layers WL and the lowermost drain-side select gate SGD among the plurality of drain-side select gates SGD can be a dummy electrode layer DWL. The dummy electrode layer DWL is not used as a control gate of the memory cell MC.

Also at least one layer of the conductive layers 70 between the lowermost electrode layer WL among the plurality of electrode layers WL and the uppermost source-side select gate SGS among the plurality of source-side select gates SGS can be a dummy electrode layer DWL.

The electrode layer WL and the dummy electrode layer DWL are not provided between the plurality of drain-side select gates SGD and between the plurality of source-side select gates SGS.

Between the electrode layers WL adjacent to each other in the stacking direction (Z-direction), an air gap 45 is provided. The plurality of electrode layers WL is stacked in the Z-direction with the air gap 45 interposed. The air gap 45 is also provided between the uppermost electrode layer WL and the dummy electrode layer DWL.

Between the drain-side select gates SGD adjacent to each other in the stacking direction, an insulating layer (an insulating body) 72 is provided. The insulating layer 72 is provided without forming a void or a seam between the drain-side select gates SGD.

The insulating layer 72 is, for example, a silicon oxide layer containing boron or phosphorus, or a silicon oxide film. Alternatively, the insulating layer 72 is a silicon nitride layer.

The insulating layer 72 is provided between the lowermost drain-side select gate SGD and the dummy electrode layer DWL in some cases. Further, the insulating layer 72 is provided between the plurality of dummy electrode layers DWL in some cases. The insulating layer 72 is not provided between the electrode layers WL.

In the example shown in FIG. 2, the air gap 45 is also provided between the source-side select gates SGS adjacent to each other in the stacking direction. The air gap 45 is also provided between the lowermost electrode layer WL (or the dummy electrode layer DWL) and the uppermost source-side select gate SGS. The air gap 45 is also provided between the source layer SL and the lowermost source-side select gate SGS.

Figure 3A:
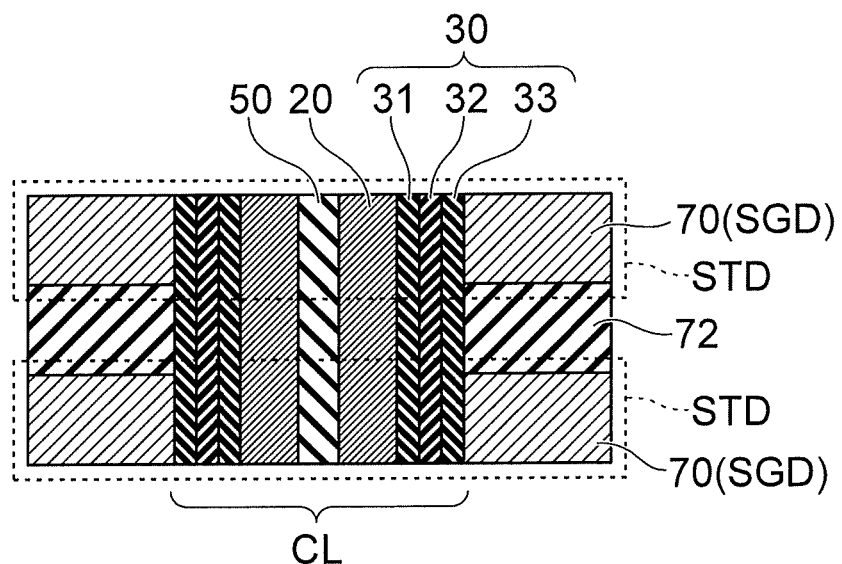
FIG. 3A is an enlarged view of a portion A in FIG. 2.
Figure 3B:
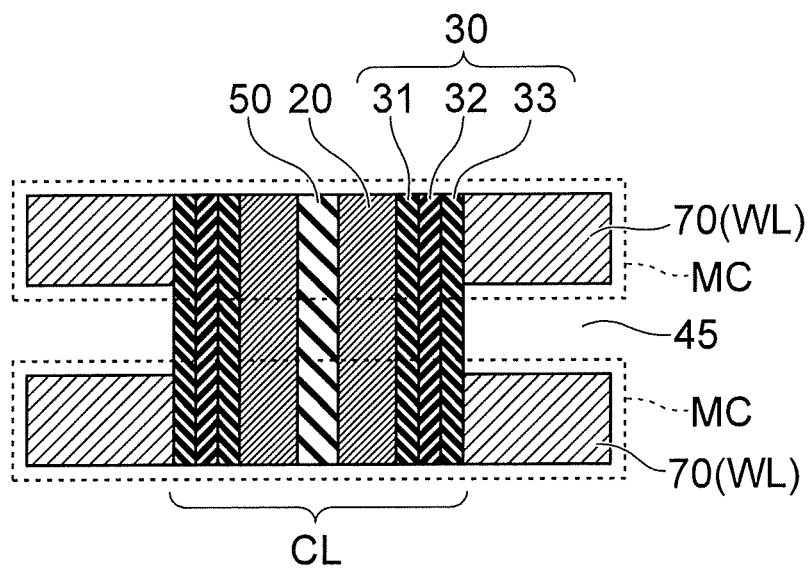
FIG. 3B is an enlarged view of a portion B in FIG. 2.

FIG. 3A is an enlarged view of a portion A in FIG. 2, and FIG. 3B is an enlarged view of a portion B in FIG. 2. FIG. 3A shows a section of the drain-side select transistor STD, and FIG. 3B shows a section of the memory cell MC. Incidentally, the source-side select transistor STS has the same sectional structure as in FIG. 3B.

The columnar portion CL includes a memory film 30, a semiconductor body 20, and an insulating core film 50. The memory film 30 is a stacked film of insulating films including a tunneling insulating film 31, a charge storage film (charge storage portion) 32, and a block insulating film 33.

The semiconductor body 20 is formed in a pipe shape extending continuously in the Z-direction in the stacked body 100. The core film 50 is provided inside the semiconductor body 20 in a pipe shape.

An upper end portion of the semiconductor body 20 is connected to the bit line BL through the contact Cb and the contact V1 shown in FIG. 1. As shown in FIG. 2, a lower end portion of the semiconductor body 20 is in contact with the source layer SL.

The memory film 30 is provided between the stacked body 100 and the semiconductor body 20, and surrounds the semiconductor body 20 from an outer circumference.

As shown in FIGS. 3A and 3B, the tunneling insulating film 31 is provided between the semiconductor body 20 and the charge storage film 32, and is in contact with the semiconductor body 20. The charge storage film 32 is provided between the tunneling insulating film 31 and the block insulating film 33. The block insulating film 33 is provided between the charge storage film 32 and the conductive layer 70 (the electrode layer WL, the dummy electrode layer DWL, and the select gates SGD and SGS).

As shown in FIG. 3B, the semiconductor body 20, the memory film 30, and the electrode layer WL constitute the memory cell MC. The memory cell MC has a vertical transistor structure in which the circumference of the semiconductor body 20 is surrounded by the electrode layer WL with the memory film 30 interposed.

In the memory cell MC having a vertical transistor structure, the semiconductor body 20 is, for example, a silicon channel body, and the electrode layer WL functions as a control gate. The charge storage film 32 functions as a data storage layer which stores electrical charges injected from the semiconductor body 20.

The semiconductor memory device of the embodiment is a non-volatile semiconductor memory device capable of electrically erasing and writing data freely, and holding storage contents even after the power is turned off.

The memory cell MC is, for example, a charge trapping memory cell. The charge storage film 32 has a lot of trap sites for trapping electrical charges in an insulating film, and includes, for example, a silicon nitride film. Alternatively, the charge storage film 32 may be a conductive floating gate whose circumference is surrounded by an insulating body.

The tunneling insulating film 31 serves as a potential barrier when electrical charges are injected from the semiconductor body 20 to the charge storage film 32 or when electrical charges stored in the charge storage film 32 are released to the semiconductor body 20. The tunneling insulating film 31 includes, for example, a silicon oxide film.

The block insulating film 33 prevents electrical charges stored in the charge storage film 32 from being released to the electrode layer WL. Further, the block insulating film 33 prevents back tunneling of electrical charges from the electrode layer WL to the columnar portion CL.

The block insulating film 33 includes, for example, a silicon oxide film. Alternatively, the block insulating film 33 may be a stacked film of a silicon oxide film and a metal oxide film (for example, an aluminum oxide film). In this case, the silicon oxide film is provided between the charge storage film 32 and the metal oxide film, and the metal oxide film can be provided between the silicon oxide film and the electrode layer WL.

As shown in FIG. 3A, the semiconductor body 20, the memory film 30, and the drain-side select gate SGD constitute the drain-side select transistor STD. The drain-side select transistor STD has a vertical transistor structure in which the circumference of the semiconductor body 20 is surrounded by the drain-side select gate SGD with the memory film 30 interposed. The memory film 30 between the drain-side select gate SGD and the semiconductor body 20 functions as a gate insulating film of the drain-side select transistor STD.

Also, the source-side select transistor STS is configured in the same manner as the drain-side select transistor STD. That is, the source-side select transistor STS has a vertical transistor structure in which the circumference of the semiconductor body 20 is surrounded by the source-side select gate SGS with the memory film 30 interposed. The memory film 30 between the source-side select gate SGS and the semiconductor body 20 functions as a gate insulating film of the source-side select transistor STS.

As shown in FIG. 1, in an upper layer portion of the stacked body 100, the drain-side select transistor STD is provided, and in a lower layer portion of the stacked body 100, the source-side select transistor STS is provided.

A plurality of drain-side select transistors STD connected in series through the semiconductor body 20 is provided. Further, a plurality of source-side select transistors STS connected in series through the semiconductor body 20 is provided. The same gate potential is applied to the plurality of drain-side select gates SGD of the plurality of drain-side select transistors STD, and the same gate potential is applied to the plurality of source-side select gates SGS of the plurality of source-side select transistors STS.

Between the drain-side select transistor STD and the source-side select transistor STS, a plurality of memory cells MC is provided. Between the drain-side select transistor STD and the memory cell MC, a dummy cell having the above-mentioned dummy electrode layer DWL as a control gate is provided. Also between the source-side select transistor STS and the memory cell MC, a dummy cell is provided in some cases. The dummy cell does not have a data storage function.

The plurality of memory cells MC, the drain-side select transistor STD, and the source-side select transistor STS are connected in series through the semiconductor body 20 of the columnar portion CL and constitutes one memory string. This memory string is disposed in a plane direction parallel to an X-Y plane, for example, in a staggered arrangement, and a plurality of memory cells MC is provided three-dimensionally in the X-direction, the Y-direction, and the Z-direction.

Next, with reference to FIG. 2, the dividing portion 60 will be described.

The dividing portion 60 has a slit ST which divides the stacked body 100 into a plurality of blocks in the Y-direction. As described later, after a cap layer (insulating layer) 43 is formed on the stacked body 100, the slit ST is formed by, for example, an RIE (reactive ion etching) method. The slit ST pierces the cap layer 43 and the stacked body 100 to reach the source layer SL. A width of the slit ST is wider than a distance between the conductive layers 70 adjacent to each other in the stacking direction.

In the example shown in FIG. 2, a film material is not buried in the slit ST, and a space extending in the Z-direction is ensured in the slit ST. The air gap 45 between the conductive layers 70 is connected to the space in the slit ST. That is, an end portion on a side of the slit ST (a slit side end portion) of the air gap 45 is not closed by a film. A film which connects end portions on a side of the slit ST (slit side end portions) of the conductive layers 70 adjacent to each other in the stacking direction with the air gap 45 interposed, is not formed.

On a side wall of the slit ST in a portion in which the plurality of drain-side select gates SGD and the insulating layers 72 are stacked, a side wall film 62 is provided. The side wall film 62 is provided on each of a pair of side walls facing each other in the Y-direction in the slit ST, and a space is formed between the pair of side wall films 62.

In the example shown in FIG. 2, an end portion on a side of the slit ST (a slit side end portion) of the plurality of drain-side select gates SGD and an end portion on a side of the slit ST (a slit side end portion) of the insulating layer 72 are covered with the side wall film 62.

A lower end of the side wall film 62 is positioned in a vicinity of a region in which the dummy electrode layer DWL is formed between the drain-side select gate SGD and the electrode layer WL.

An upper end of the side wall film 62 is positioned at a height above an upper surface of the stacked body 100 and below an upper surface of the cap layer 43.

The insulating layer 72 has etching selectivity to the side wall film 62. As described later with reference to FIG. 35, for example, the insulating layer 72 is a silicon nitride layer (thermal SiN layer) formed by a thermal CVD (chemical vapor deposition) method, and the side wall film 62 is a silicon oxide film (LTO film) formed by an LTO (low temperature oxide) method. Alternatively, the insulating layer 72 is a BSG (boron silicate glass) layer or a PSG (phosphorus silicate glass) layer, and the side wall film 62 is an LTO film or a silicon nitride film (plasma SiN film) formed by a plasma CVD method. Further, the insulating layer 72 is a $SiO_2$ film, and the side wall film 62 is a plasma SiN film, an SiC film, or an SiCO film.

On the cap layer 43, a sealing film 44 is provided. A part of the sealing film 44 also penetrates into the slit ST and closes an upper end of the slit ST. When the sealing film 44 is formed, the side wall film 62 serves as an obstacle to the penetration of the sealing film 44 into the slit ST, and the sealing film 44 is formed so as to be blocked in a vicinity of an upper end of the side wall film 62. Therefore, the sealing film 44 closes the upper end of the slit ST in a vicinity of the upper end of the side wall film 62.

In order to increase a density of the memory cell MC, the number of electrode layers WL to be stacked is desired to be increased. On the other hand, from a viewpoint of ease of processing of the stacked body 100, it is desirable to suppress the increase in the thickness of the entire stacked body 100. Therefore, as the increase in the number of electrode layers WL to be stacked, an interval between the electrode layers WL adjacent to each other in the stacking direction is also desired to be reduced. Such reduction of the interval between the electrode layers WL is likely to cause electrical breakdown between the electrode layers WL, or interference (a variation in the threshold voltage, etc.) between the memory cells MC due to capacity coupling between the electrode layers WL.

According to the embodiment, as shown in FIGS. 2 and 3B, the air gap 45 is formed between the electrode layers WL of the memory cells MC adjacent to each other in the stacking direction. Due to this, a breakdown voltage between the adjacent electrode layers WL can be improved. Further, a capacity between the adjacent electrode layers WL can be reduced, and therefore, the interference between the adjacent memory cells MC can be suppressed.

Between the plurality of drain-side select gates SGD, not an air gap, but the insulating layer 72 is provided. As described later, among the plurality of insulating layers 72 formed sequentially from the lowermost layer when forming the stacked body 100, the insulating layer 72 of a layer which should be converted into the air gap 45 is removed by etching through the slit ST, and the insulating layer 72 in a portion protected by the side wall film 62 is left. By partially leaving the insulating layers 72 in the stacked body 100, the strength of the stacked body 100 can be increased. The same gate potential is applied to the plurality of drain-side select gates SGD, and therefore, a high electric field is not applied between the drain-side select gates SGD adjacent to each other in the stacking direction, and also a problem such as inter-cell interference does not occur.

The plurality of conductive layers 70 stacked with the air gap 45 interposed is in contact with a side surface of the columnar portion CL so as to surround the side surface of the plurality of columnar portions CL. The plurality of conductive layers 70 is supported by physical bonding to such a plurality of columnar portions CL, and the air gap 45 between the conductive layers 70 is maintained.

The insulating layer 72 is not a layer formed by penetrating an insulating film into the air gap between the conductive layers 70, but is a layer formed by stacking sequentially from the bottom when forming the stacked body 100. Therefore, as compared with the former case, the insulating layer 72 having a predetermined film thickness with no void or seam can be interposed between the drain-side select gates SGD. This suppresses a variation in the threshold voltage of the drain-side select transistor STD.

The sealing film 44 is an insulating film, and is, for example, a silicon oxide film formed by a plasma CVD method. The sealing film 44 may penetrate into the slit ST below the side wall film 62 and close an end portion on a side of the slit ST of the air gap 45. In this case, when the interval between the electrode layers WL adjacent to each other in the stacking direction becomes narrower, a creepage distance between the electrode layers WL along the surface of the insulating film formed in the end portion of the air gap 45 also becomes shorter, and the breakdown voltage may be decreased in the end portion on a side of the slit ST of the electrode layer WL.

As in the example shown in FIG. 2, a film is not formed in the end portion on a side of the slit ST of the air gap 45, that is, in the case of a structure in which the electrode layers WL adjacent to each other in the stacking direction are not connected to each other in the end portions on a side of the slit ST through a film, a high breakdown voltage between the adjacent electrode layers WL can be ensured.

Next, a method for manufacturing the memory cell array shown in FIG. 2 will be described with reference to FIGS. 4 to 13. The sections shown in FIGS. 4 to 13 correspond to the section shown in FIG. 2.

Figure 4:
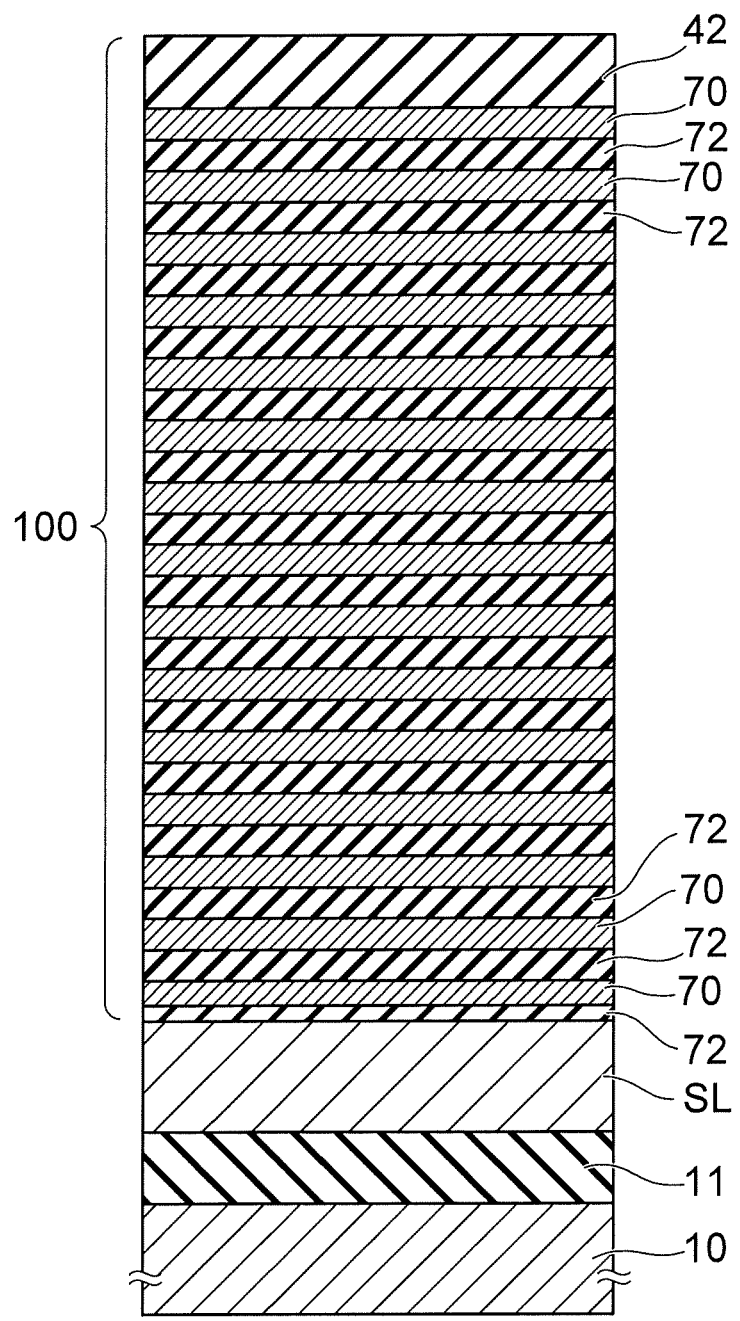
FIG. 4 to FIG. 13 are schematic sectional views showing a method for manufacturing the semiconductor device of the embodiment.

As shown in FIG. 4, an insulating layer 11 is formed on a substrate 10, and a source layer SL is formed on the insulating layer 11.

A stacked body 100 is formed on the source layer SL. An insulating layer (second film) 72 and a conductive layer (first film) 70 are alternately stacked on the source layer SL. A process of alternately stacking the insulating layer 72 and the conductive layer 70 is repeated, whereby a plurality of insulating layers 72 and a plurality of conductive layers 70 are formed on the source layer SL. An insulating layer 42 is formed on the uppermost conductive layer 70.

Figure 5:
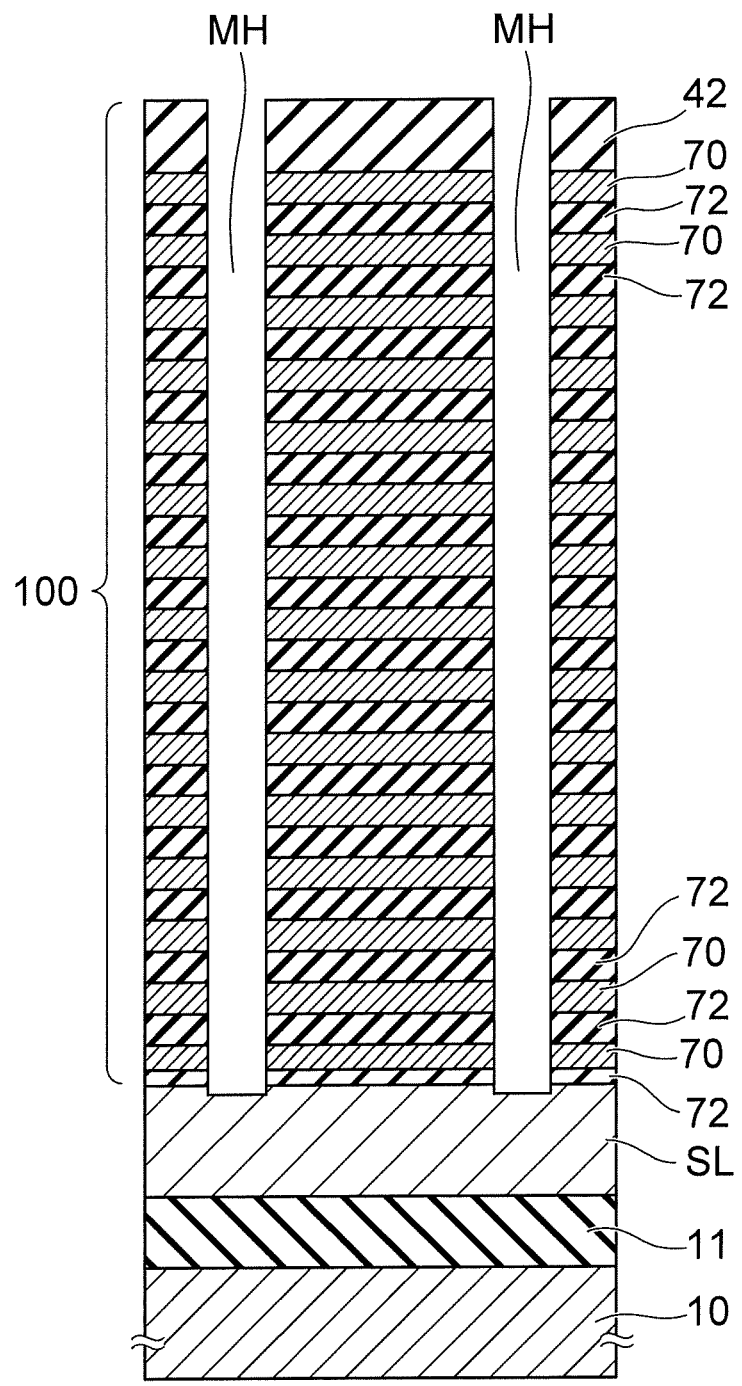

As shown in FIG. 5, a plurality of memory holes MH is formed in the stacked body 100. The memory hole MH is formed by an RIE method using a mask layer (not shown). The memory hole MH pierces the stacked body 100 to reach the source layer SL.

Figure 6:
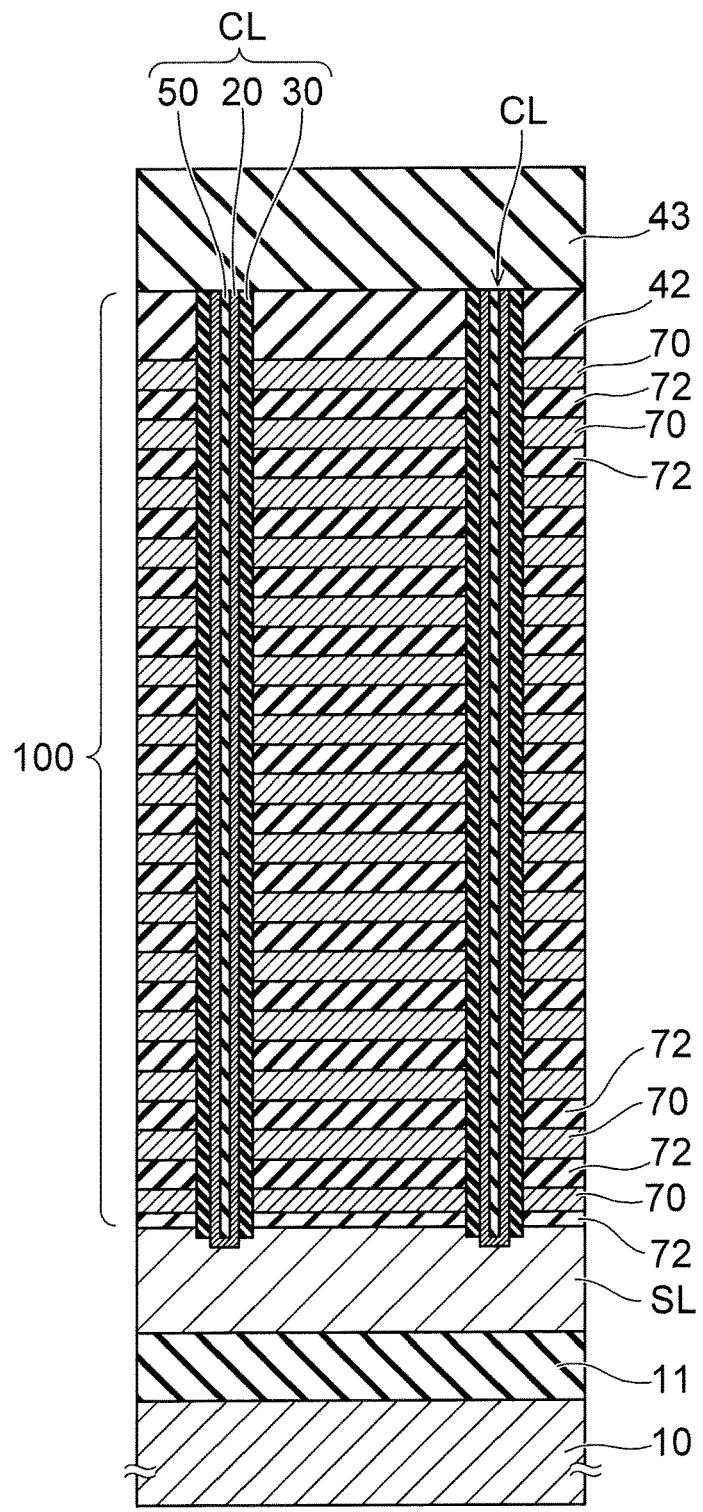

In the memory hole MH, a columnar portion CL is formed as shown in FIG. 6. In the memory hole MH, a memory film 30, a semiconductor body 20, and a core film 50 are formed sequentially. A lower end portion of the semiconductor body 20 is in contact with the source layer SL.

After forming the columnar portion CL, a cap layer 43 is formed on the stacked body 100. The cap layer 43 covers an upper end of the columnar portion CL.

Figure 7:
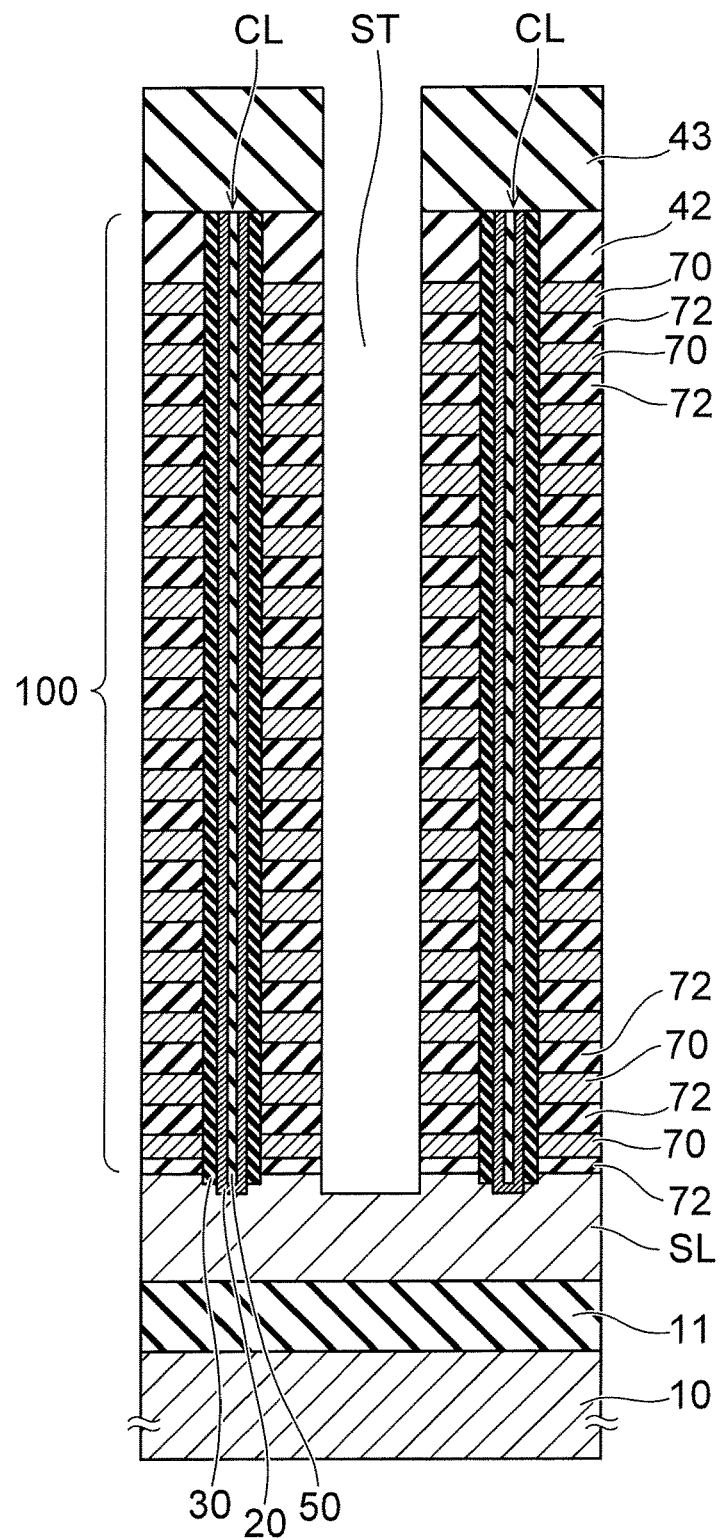

Then, as shown in FIG. 7, a slit ST is formed in the cap layer 43 and the stacked body 100. The slit ST is formed by an RIE method using a mask layer (not shown). The slit ST pierces the cap layer 43 and the stacked body 100 to reach the source layer SL.

Figure 8:
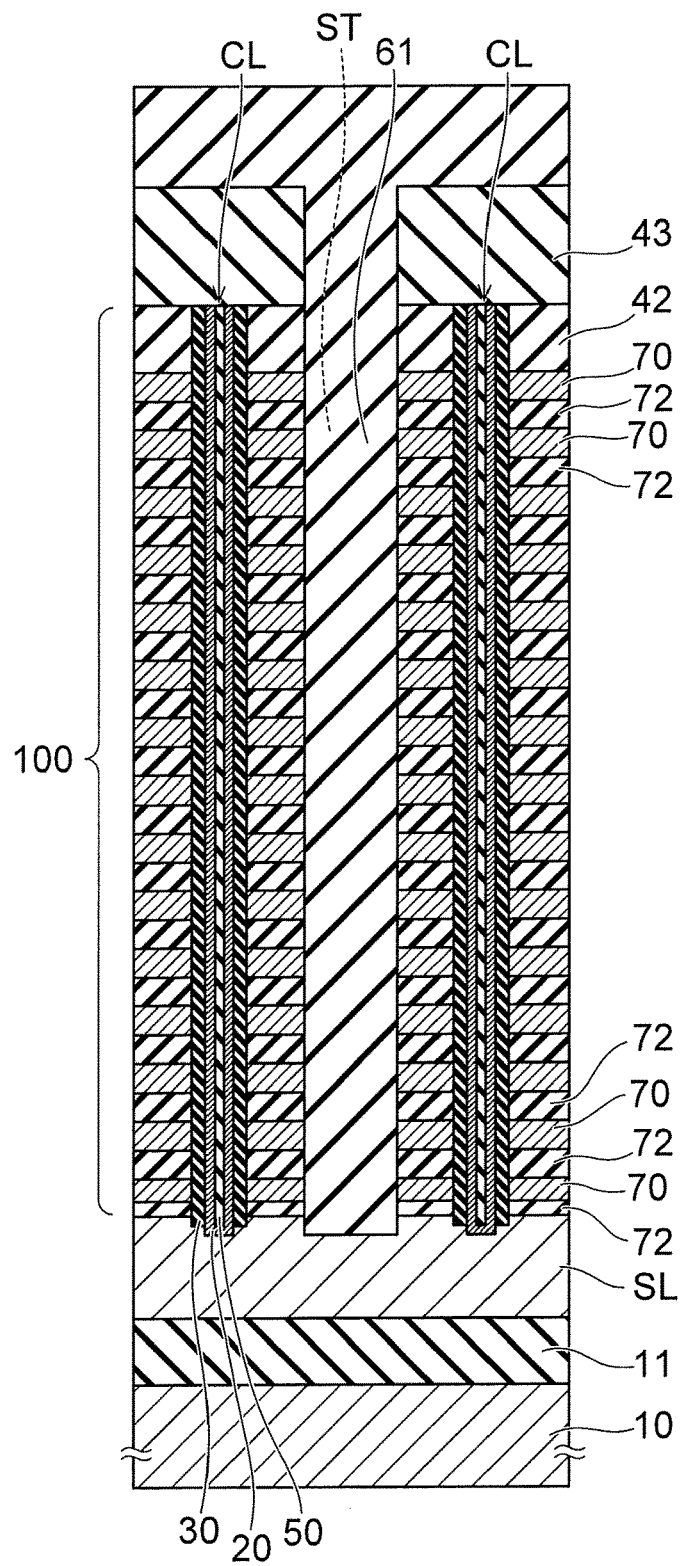

In the slit ST, a cover film (or a sacrifice film) 61 is buried as shown in FIG. 8. The cover film 61 is also formed on the cap layer 43.

Figure 9:
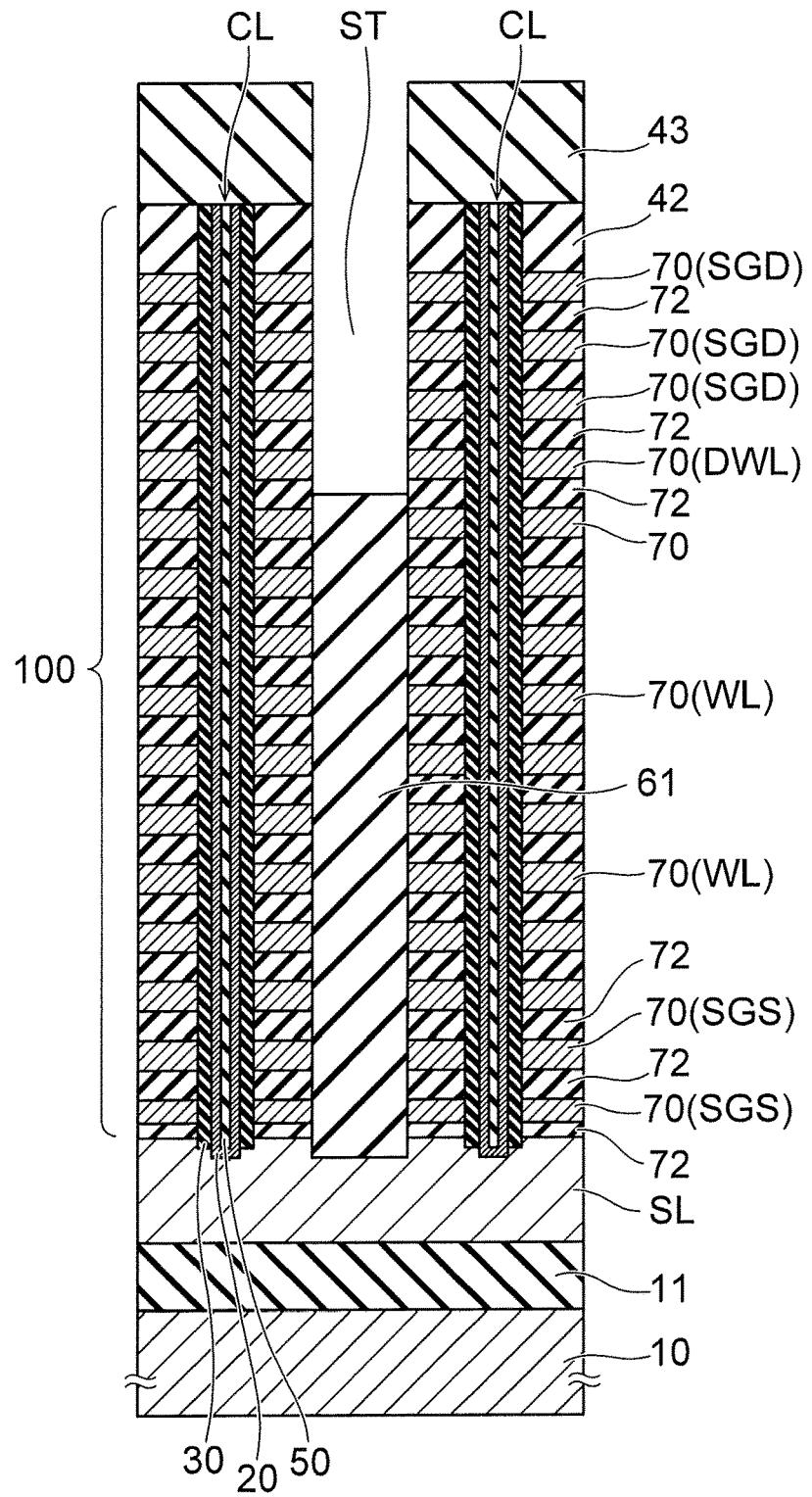

The cover film 61 is etched back by an RIE method, and as shown in FIG. 9, an upper end of the cover film 61 in the slit ST is retreated. The cover film 61 on the cap layer 43 is removed.

The upper end of the cover film 61 is retreated so that an end portion on a side of the slit ST of the insulating layer 72 between the plurality of drain-side select gates SGD is exposed to the slit ST. In FIG. 9, an example in which the upper end of the cover film 61 is retreated to a stacked region of the dummy electrode layer DWL below a stacked portion of a plurality of (for example, three layers of) drain-side select gates SGD is shown. The upper end of the cover film 61 is not retreated to a stacked region of the electrode layer WL of the memory cell MC. The end portion on a side of the slit ST in the insulating layer 72 between the electrode layers WL is covered with the cover film 61 so as not to be exposed to the slit ST.

Figure 10:
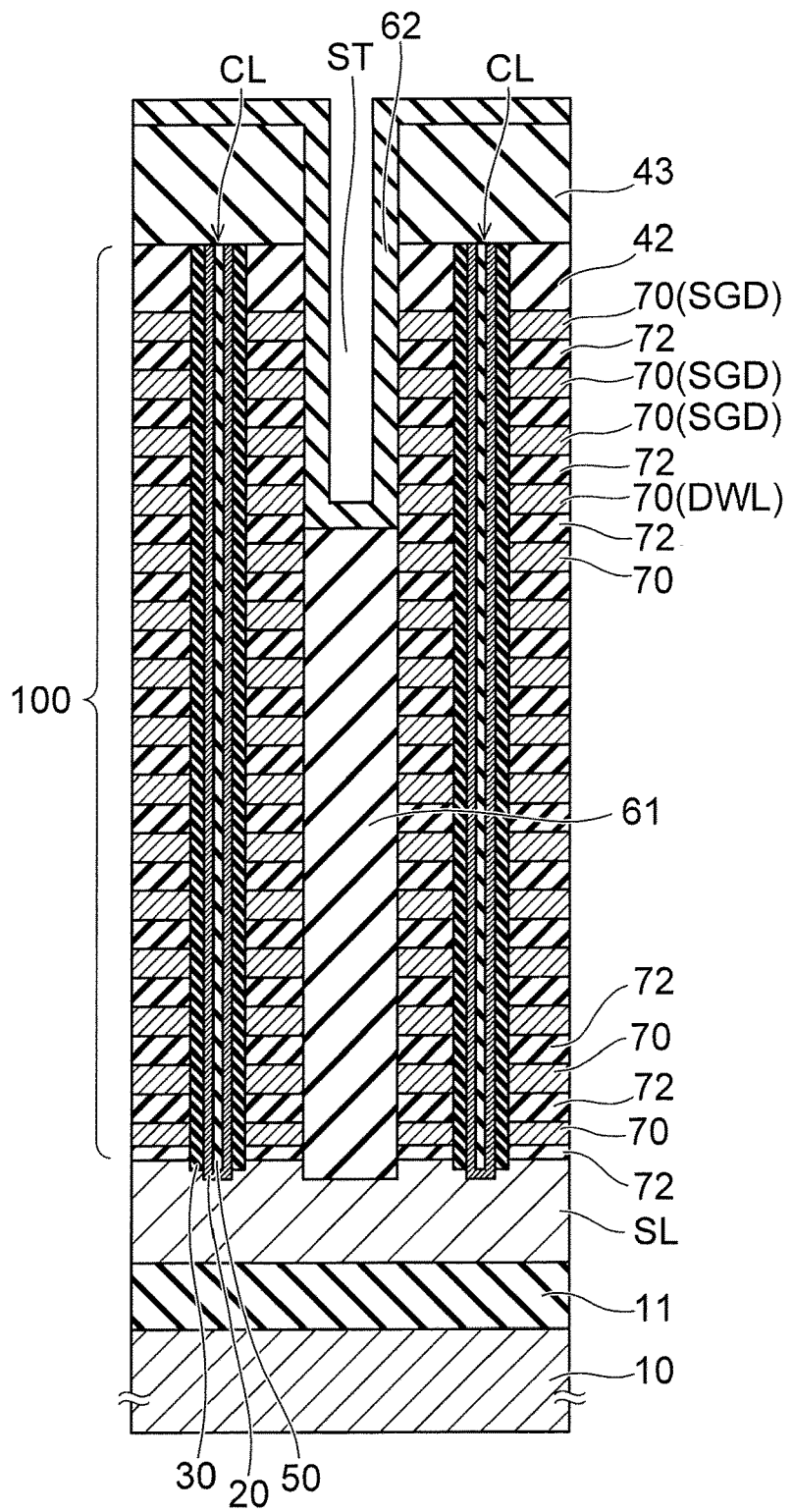

Thereafter, as shown in FIG. 10, in the slit ST on the cover film 61, a side wall film 62 is formed. The side wall film 62 is formed conformally along an upper surface of the cap layer 43, a side wall of the slit ST, and an upper surface of the cover film 61. A space is left inside the side wall film 62.

Figure 11:
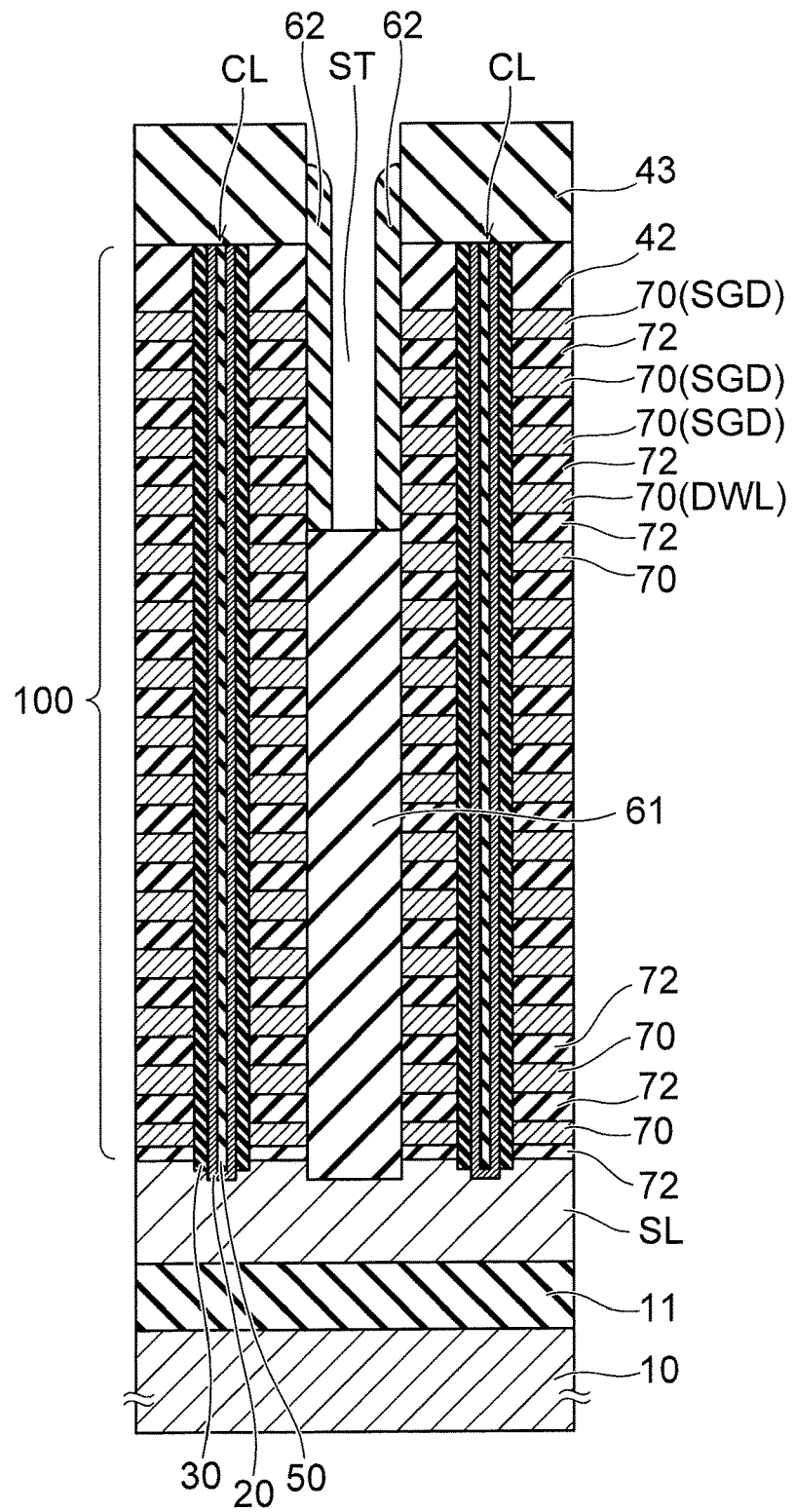

The side wall film 62 is etched back by an RIE method, and the side wall film 62 formed on the upper surface of the cover film 61 is removed. As shown in FIG. 11, the upper surface of the cover film 61 is exposed to a space in the slit ST thereabove. An upper end of the side wall film 62 is, for example, retreated to a height on a lateral side of the cap layer 43.

Figure 12:
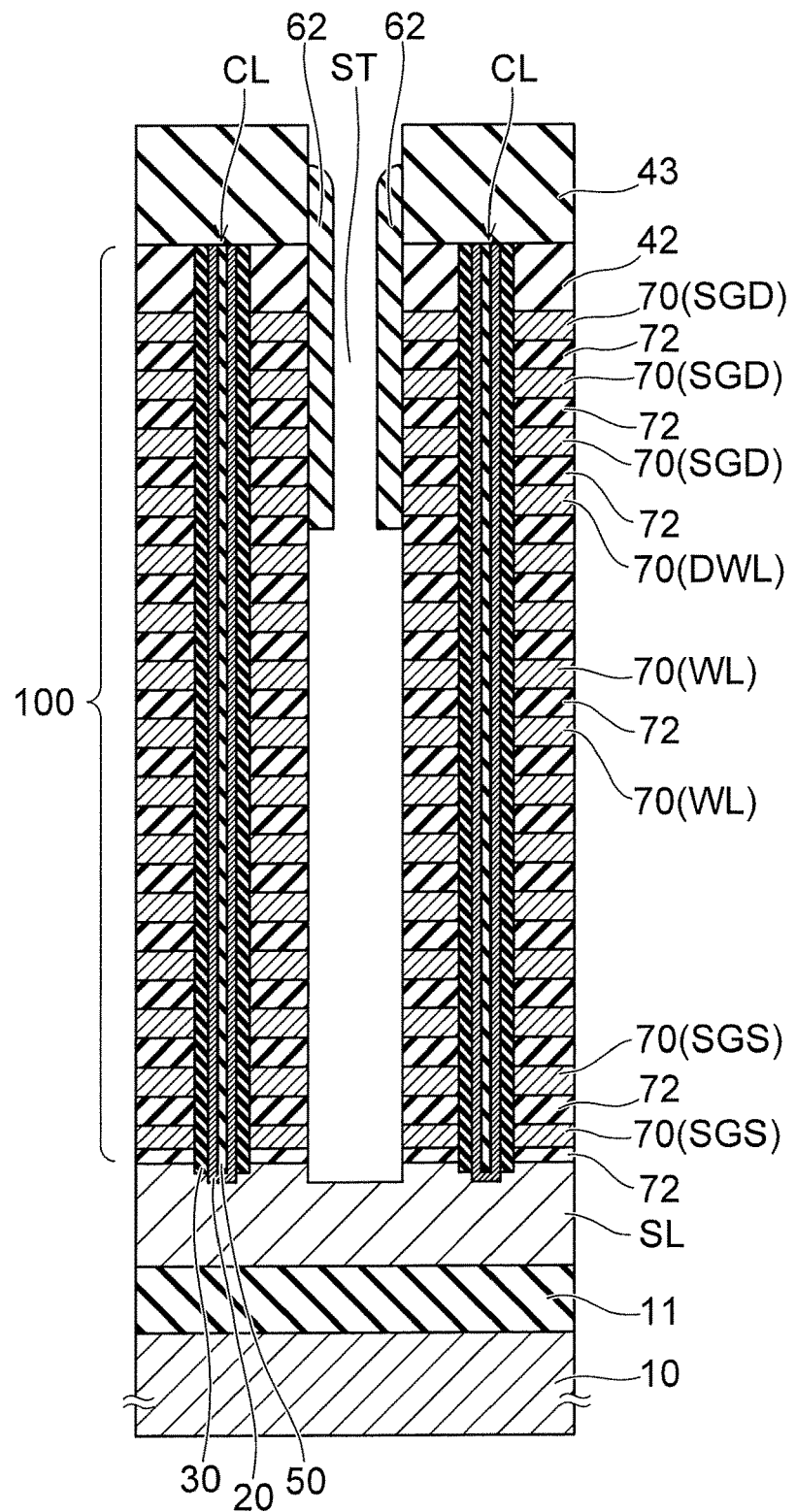

Thereafter, the cover film 61 is removed by etching. As shown in FIG. 12, the side wall film 62 is left. The side wall film 62 covers an end portion on a side of the slit ST of the plurality of drain-side select gates SGD, and an end portion on a side of the slit ST of the insulating layer 72 between the drain-side select gates SGD. Further, in the example shown in FIG. 12, the side wall film 62 also covers an end portion on a side of the slit ST of the insulating layer 72 between the lowermost drain-side select gate SGD and the dummy electrode layer DWL, and an end portion on a side of the slit ST of the dummy electrode layer DWL.

Then, by etching through the slit ST, the insulating layer 72 whose end portion on a side of the slit ST is not covered with the side wall film 62 is removed. Etching of the insulating layer 72 proceeds from the end portion exposed to the slit ST.

Figure 13:
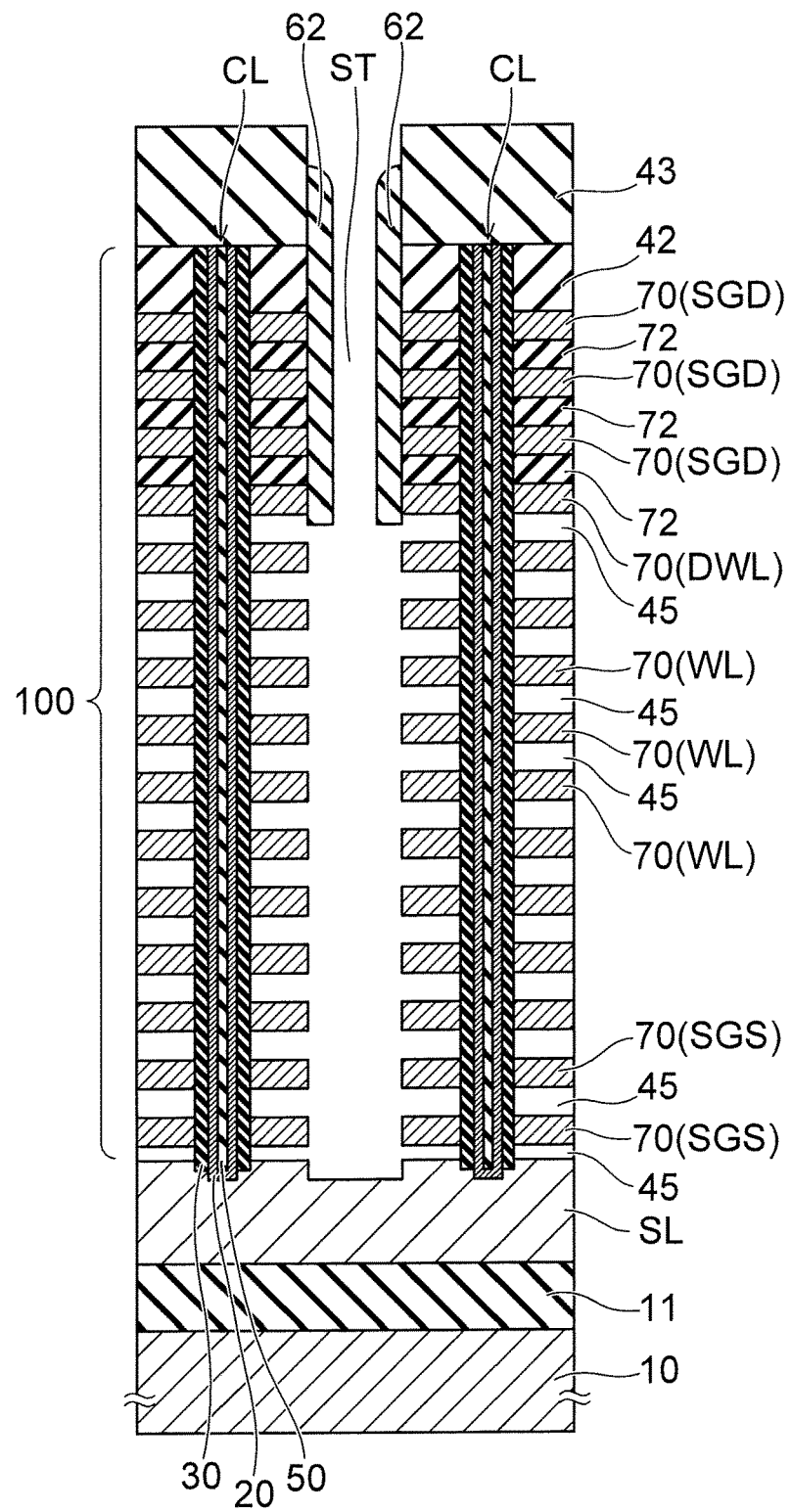

By this etching of the insulating layer 72, an air gap 45 is formed between the plurality of electrode layers WL as shown in FIG. 13. The air gap 45 is also formed between the plurality of source-side select gates SGS, between the lowermost source-side select gate SGS and the source layer SL, between the lowermost electrode layer WL (or the dummy electrode layer DWL) and the uppermost source-side select gate SGS, and between the uppermost electrode layer WL and the dummy electrode layer DWL.

The insulating layer 72 on the upper layer side shut off from the slit ST by the side wall film 62 is left without being etched. The insulating layer 72 between the plurality of drain-side select gates SGD, and the insulating layer 72 between the lowermost drain-side select gate SGD and the dummy electrode layer DWL is left without being etched.

Thereafter, as shown in FIG. 2, a sealing film 44 is formed on the cap layer 43. A part of the sealing film 44 is also formed on a side wall in a vicinity of an upper end of the slit ST to close the upper end of the slit ST so as to be blocked by an upper end of the side wall film 62.

When a position at which the sealing film 44 closes the upper end of the slit ST comes closer to the upper surface of the sealing film 44, for example, in a CMP (chemical mechanical polishing) process of a subsequent process, a crack is likely to penetrate into a portion above the slit ST in the sealing film 44. This crack may serve as a path through which a chemical solution, a slurry, or the like penetrates into the slit ST.

In order not to generate the above-mentioned crack, the position at which the sealing film 44 closes the upper end of the slit ST is desirably set to a height not higher than the upper surface of the cap layer 43.

Here, as a comparative example, a case where the insulating layer 72 between the drain-side select gates SGD is removed without providing the side wall film 62, and the air gap 45 is also formed between the drain-side select gates SGD may be exemplified.

In this comparative example, a part of the sealing film 44 grows (is deposited) along a side wall of the slit ST from the upper end of the slit ST, and is likely to be deposited also in the air gap 45 on an upper layer side, that is, between the drain-side select gates SGD. A film (a part of the sealing film 44) formed in the air gap 45 at this time grows (is deposited) along a wall surface of the air gap 45 with a space left inside, and it is extremely difficult to control the film thickness. Such a variation in the film thickness of the insulating film between the drain-side select gates SGD can cause a variation in the properties (a threshold voltage, etc.) of the drain-side select transistor STD.

On the other hand, according to the embodiment, as described above, the insulating layer 72 having a predetermined film thickness formed when forming the stacked body 100 is left between the drain-side select gates SGD, and therefore, stable properties of the drain-side select transistor STD are obtained.

In order to cover the end portion of the insulating layer 72 between the drain-side select gates SGD with the side wall film 62, a position of the upper end of the cover film 61 shown in FIG. 9 is located below the insulating layer 72 between the drain-side select gates SGD. However, when the upper end of the cover film 61 is retreated to a height such that the insulating layer 72 between the electrode layers WL of the memory cells MC is exposed to the slit ST, also the end portion of the insulating layer 72 between the electrode layers WL is covered with the side wall film 62, and therefore, the insulating layer 72 is left between the electrode layers WL.

According to the embodiment, a variation in an etching back amount of the cover film 61 (a position of the upper end of the cover film 61) can be absorbed in a region of the dummy electrode layer DWL provided between the drain-side select gate SGD and the electrode layer WL.

The dummy electrode layer DWL is not used as a control gate of the memory cell MC, and therefore, as in the example shown in FIG. 2, even if the insulating layer 72 is left between the drain-side select gate SGD and the dummy electrode layer DWL, a problem of a decrease in the breakdown voltage of the memory cell MC or inter-cell interference does not occur.

Further, by providing a plurality of dummy electrode layers DWL, an allowable variation range of the etching back amount of the cover film 61 in the process shown in FIG. 9 can be expanded.

Alternatively, the drain-side select gate SGD is stacked on the uppermost electrode layer WL with a thick insulating layer 72 interposed without providing a conductive layer 70, and a variation in the etching back amount of the cover film 61 may be absorbed at a position of the thick insulating layer 72.

Figure 14:
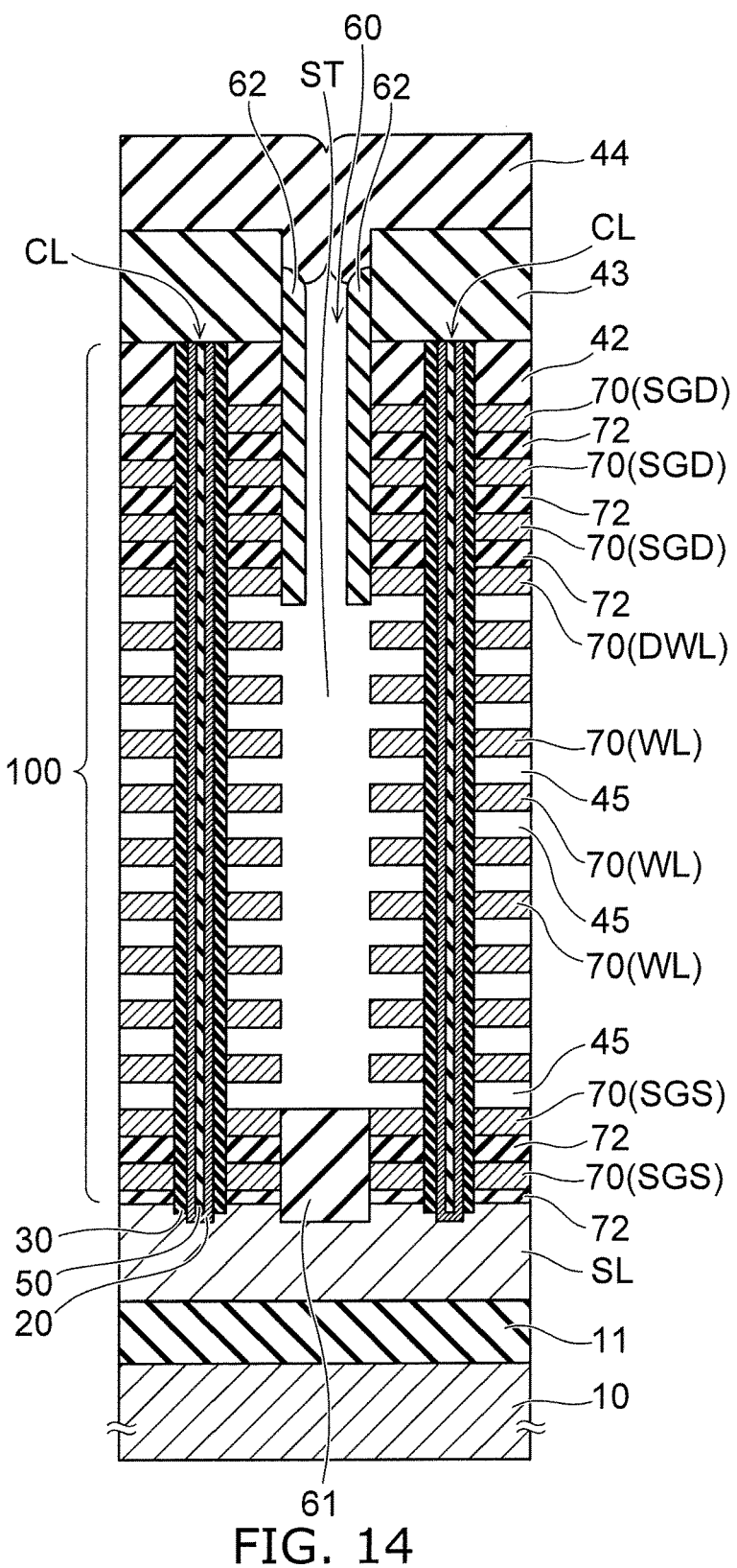
FIG. 14 is a schematic sectional view of a semiconductor device of the embodiment.

FIG. 14 shows a structural example in which the insulating layer 72 is further left also between the source-side select gates SGS in addition to the configuration in FIG. 2.

After forming the side wall film 62, not all the cover film 61 is removed, but the cover film 61 is left in a lower portion of the slit ST. In the example shown in FIG. 14, for example, an upper end of the cover film 61 is positioned at a height in a vicinity of a lateral side of the source-side select gate SGS being a second layer from the bottom so as to cover an end portion of the insulating layer 72 between two layers of the source-side select gates SGS. Further, the insulating layer 72 between the lowermost source-side select gate SGS and the source layer SL is also protected by the cover film 61 and is left without being etched.

Also in this case, in order to absorb a variation in the etching back amount (a position of the upper end) of the cover film 61, a dummy electrode layer DWL or a thick insulating layer 72 can be provided between the electrode layer WL of the memory cell MC and the source-side select gate SGS.

By leaving the insulating layer 72 also between the plurality of source-side select gates SGS, the strength of the stacked body 100 can be further increased. The same gate potential is applied to the plurality of source-side select gates SGS, and therefore, a high electric field is not applied between the source-side select gates SGS adjacent to each other in the stacking direction, and also a problem such as inter-cell interference does not occur.

In the processes shown in FIGS. 4 to 13, the above-mentioned processes can be realized by appropriately combining the materials of the cap layer 43, the cover film 61, the side wall film 62, the insulating layer 72, and the sealing film 44 so as to make the respective components have an appropriate etching selection ratio among them.

FIG. 35 is a view (table) showing examples of combination of materials of the cap layer 43, the cover film 61, the side wall film 62, the insulating layer 72, and the sealing film 44. In FIG. 35, a row direction shows the examples of combination of the above-mentioned respective components.

The cover film 61 of polysilazane can be removed or retreated by a wet method using $H_3PO_4$. The cover film 61 of SOC (spin on carbon) can be removed or retreated by an ashing method. The cover film 61 of amorphous silicon can be removed or retreated by a wet method using TMY (trimethyl-2-hydroxyethyl ammonium hydroxide). The cover film 61 of a carbon-based film can be removed or retreated by an ashing method. The cover film 61 of BSG or PSG can be removed or retreated by a VPC (vapor phase cleaning) method or a CDE (chemical dry etching) method.

The insulating layer 72 of SiN formed by a thermal CVD method can be removed by a wet method using $H_3PO_4$ or a CDE method. The insulating layer 72 of BSG or PSG can be removed by a VPC method or a CDE method. The insulating layer 72 of $SiO_2$ can be removed by a wet method using DHF (diluted hydrofluoric acid) or BHF (Buffered HF) or a CDE method.

In the case where the insulating layer 72 and the cover film 61 are both BSG or PSG, when the insulating layer 72 is removed (when the air gap 45 is formed), the cover film 61 can be removed.

Figure 15:
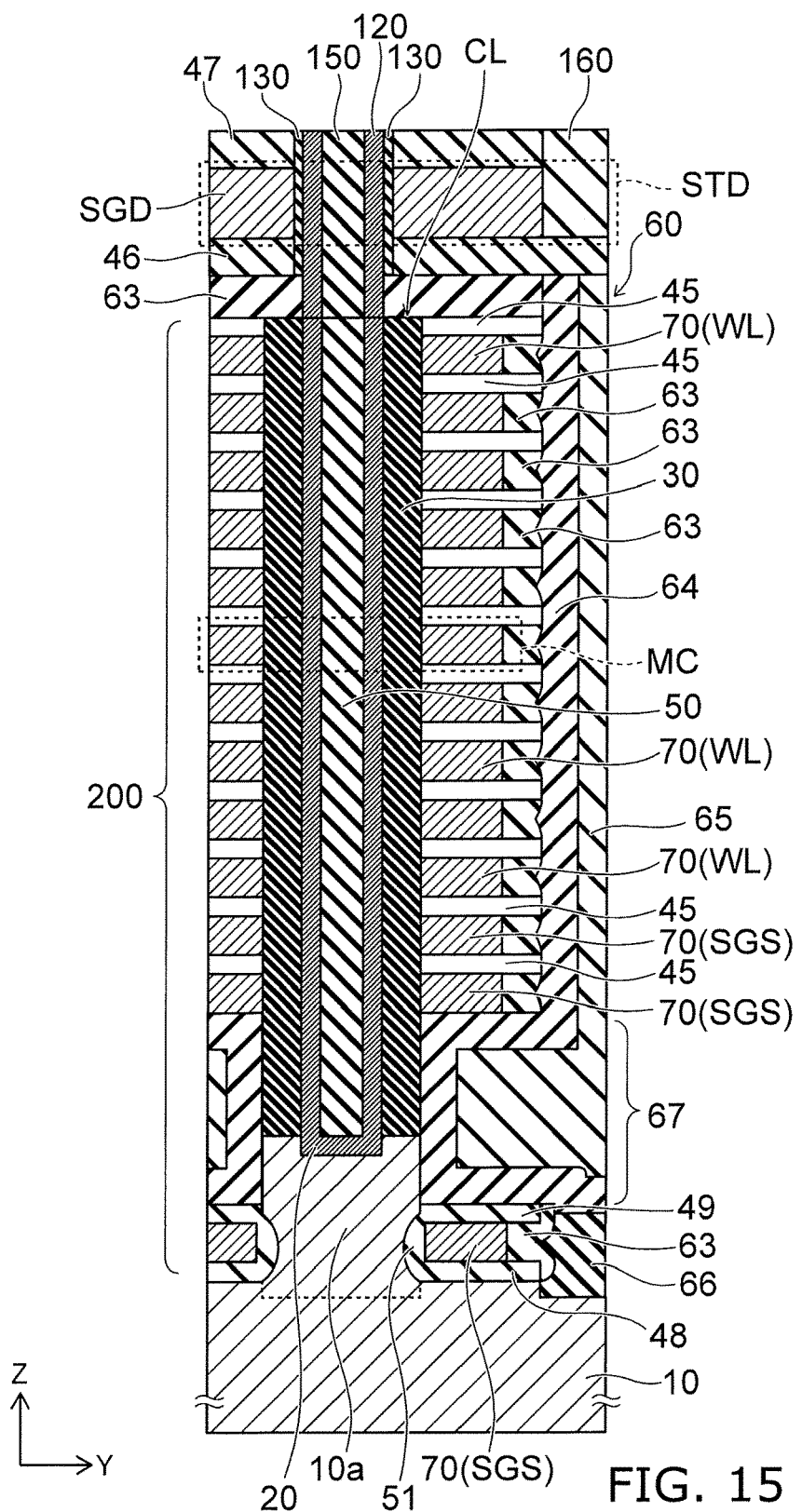
FIG. 15 is a schematic sectional view of a semiconductor device of the embodiment.

FIG. 15 is a schematic sectional view showing another example of the memory cell array of the embodiment.

In the example shown in FIG. 15, a stacked body 200 is provided on a substrate 10 as a foundation layer. The stacked body 200 includes a plurality of conductive layers 70. The plurality of conductive layers 70 includes a plurality of source-side select gates SGS and a plurality of electrode layers WL. In the example shown in FIG. 15, three layers of source-side select gates SGS are provided below the lowermost electrode layer WL.

The substrate 10 includes a convex portion 10a in a substantially circular columnar shape on a surface of substrate 10. The substrate 10 is a silicon substrate, and the convex portion 10a is a silicon epitaxial growth portion.

On the convex portion 10a, the above-mentioned columnar portion CL including a memory film 30, a semiconductor body 20, and a core film 50 is provided. The columnar portion CL extends in the stacked body 200 in a stacking direction of the stacked body 200, and a lower end portion of the semiconductor body 20 is in contact with the convex portion 10a.

The lowermost source-side select gate SGS is provided on a circumference of the convex portion 10a. An insulating layer 48 is provided between the lowermost source-side select gate SGS and the surface of the substrate 10. An insulating film 51 is provided between the lowermost source-side select gate SGS and a side surface of the convex portion 10a.

An insulating layer 49 is provided on the lowermost source-side select gate SGS. An insulating layer 67 is provided on the insulating layer 49.

The source-side select gate SGS being the second layer from the bottom is provided on the insulating layer 67. On the source-side select gate SGS being the second layer from the bottom, the source-side select gate SGS being the third layer from the bottom is provided with an air gap 45 interposed. The source-side select gate SGS being the second layer from the bottom is positioned above an upper surface of the convex portion 10a of the substrate 10.

On the source-side select gate SGS being the third layer from the bottom, the lowermost electrode layer WL is provided with the air gap 45 interposed. On the lowermost electrode layer WL, the plurality of electrode layers WL is stacked with the air gap 45 interposed.

On the uppermost electrode layer WL, a cap film 63 is provided with the air gap 45 interposed. An insulating layer 46 is provided on the cap film 63, and one layer of drain-side select gate SGD is provided as an upper-side select gate layer on the insulating layer 46. An insulating layer 47 is provided on the drain-side select gate SGD.

In the stacked body 200, the plurality of conductive layers 70 above the insulating layer 67 has substantially the same thickness. The thickness of the drain-side select gate SGD is thicker than the thickness of one layer of the conductive layer 70 above the insulating layer 67. The drain-side select gate SGD is, for example, a polycrystalline silicon layer doped with an impurity.

In the insulating layer 47, the drain-side select gate SGD, the insulating layer 46, and the cap film 63, a semiconductor body 120 extends in a stacking direction of these components. A lower end of the semiconductor body 120 is in contact with an upper end of the semiconductor body 20 of the columnar portion CL. An upper end of the semiconductor body 120 is connected to a bit line BL shown in FIG. 1 through a contact (not shown). The semiconductor body 120 is formed in a pipe shape, and a core film 150 is provided inside the semiconductor body 120.

A gate insulating film 130 is provided between the semiconductor body 120 and the drain-side select gate SGD. The semiconductor body 120, the gate insulating film 130, and the drain-side select gate SGD constitute a drain-side select transistor STD. The drain-side select transistor STD has a vertical transistor structure in which the circumference of the semiconductor body 120 is surrounded by the drain-side select gate SGD with the gate insulating film 130 interposed.

The stacked body 200 is divided into a plurality of blocks in the Y-direction by a dividing portion 60. A cover film 66 is provided on a surface of the substrate 10 on the bottom of the dividing portion 60. On the cover film 66, an insulating film 65 and an insulating film 64 are provided. The insulating film 65 and the insulating film 64 are provided along a side surface of the stacked body 200 in the dividing portion 60. Further, the insulating film 65 and the insulating film 64 constitute an insulating layer 67.

The insulating film 64 closes an end portion of the air gap 45. An upper end of the cover film 66 is positioned above an upper surface of the lowermost source-side select gate SGS. In the example shown in FIG. 15, the upper end of the cover film 66 is positioned in a vicinity of a lateral side of the insulating layer 49.

The cap film 63 is provided between an end portion of the conductive layer 70 above the insulating layer 67 and the insulating film 64. Also the air gap 45 is formed between the cap films 63 adjacent to each other in the stacking direction. Also the cap film 63 is provided between an end portion of the lowermost conductive layer 70 (source-side select gate SGS) and the cover film 66.

The drain-side select gate SGD is divided in the Y-direction by a dividing portion 160 which is an insulating film at least at a position above the dividing portion 60.

Also in the structure shown in FIG. 15, the air gap 45 is formed between the electrode layers WL of the memory cells MC adjacent to each other in the stacking direction (Z-direction). Therefore, a breakdown voltage between the adjacent electrode layers WL can be improved. Further, a capacity between the adjacent electrode layers WL can be reduced, and thus, the interference between the adjacent memory cells MC can be suppressed.

The plurality of conductive layers 70 stacked with the air gap 45 interposed above the insulating layer 67 is in contact with a side surface of the columnar portion CL so as to surround the side surface of the plurality of columnar portions CL. The plurality of conductive layers 70 is supported by such physical bonding to the plurality of columnar portions CL, and the air gap 45 between the conductive layers 70 is maintained.

Next, a method for manufacturing the memory cell array shown in FIG. 15 will be described with reference to FIGS. 16 to 31B. The sections shown in FIGS. 16 to 31B correspond to the section shown in FIG. 15.

Figure 16:
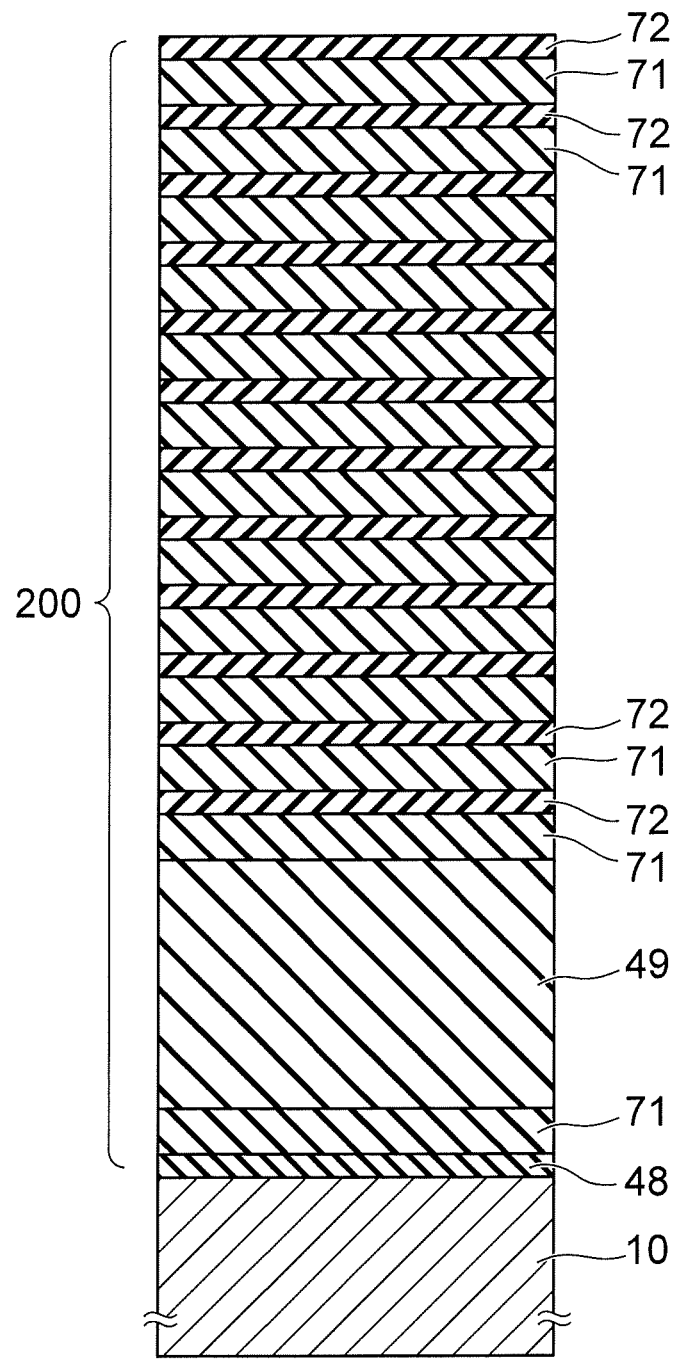
FIG. 16 to FIG. 29 are schematic sectional views showing a method for manufacturing the semiconductor device of the embodiment.

As shown in FIG. 16, a stacked body 200 is formed on a substrate 10. A second film and a first film are alternately stacked on the substrate 10. An insulating layer (second film) 48 is formed on a surface of the substrate 10, a sacrifice layer (first film) 71 is formed on the insulating layer 48, and an insulating layer (second film) 49 is formed on the sacrifice layer 71.

Further, a process of alternately forming the sacrifice layer (first film) 71 and an insulating layer (second film) 72 on the insulating layer 49 is repeated, whereby a plurality of sacrifice layers 71 and a plurality of insulating layers 72 are stacked on the insulating layer 49.

The insulating layer 48, the insulating layer 49, and the insulating layer 72 are each, for example, a silicon oxide layer. The sacrifice layer 71 is, for example, a silicon nitride layer.

Figure 17:
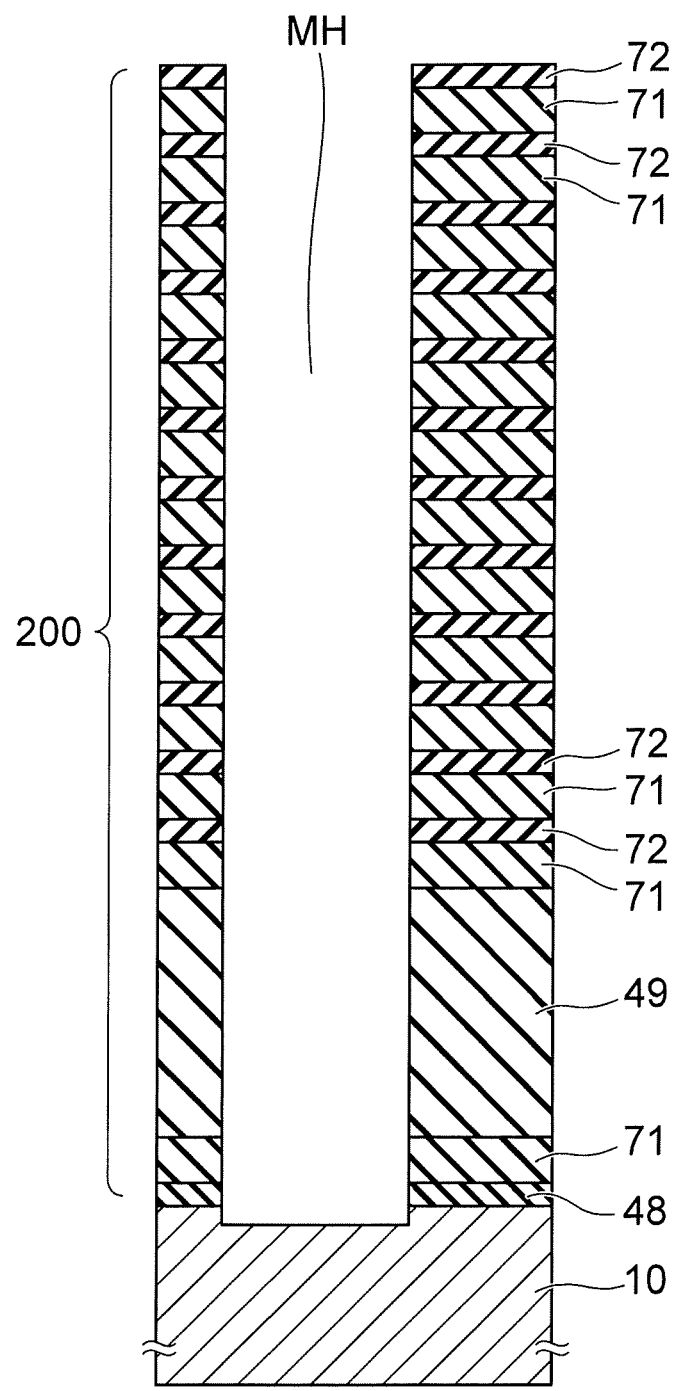

As shown in FIG. 17, a memory hole MH is formed in the stacked body 200. The memory hole MH is formed by an RIE method using a mask layer (not shown). The memory hole MH pierces the stacked body 200 to reach the substrate 10.

Figure 18:
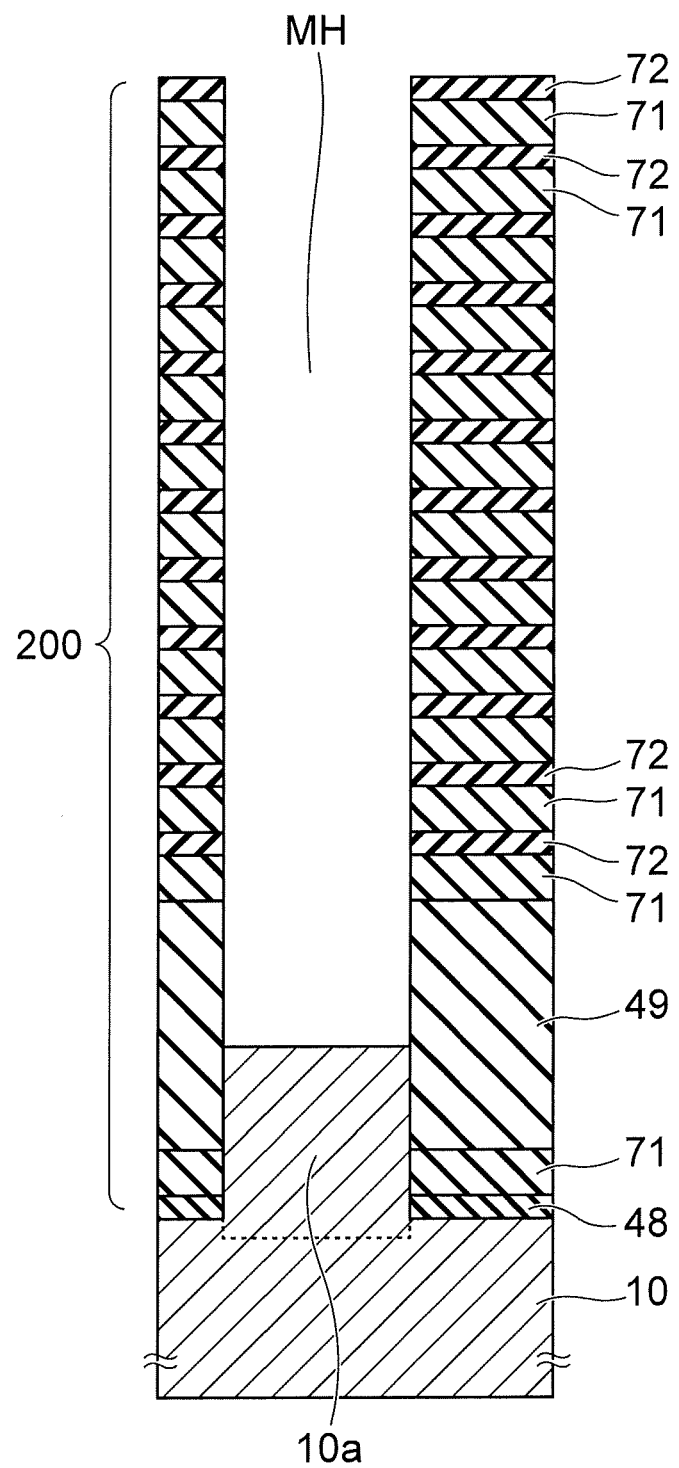

Silicon is epitaxially grown on the substrate 10 exposed to a bottom of the memory hole MH, and as shown in FIG. 18, a convex portion 10a is formed as a portion of the substrate 10 on the bottom of the memory hole MH. An upper surface of the convex portion 10a is positioned at a height between the lowermost sacrifice layer 71 and the sacrifice layer 71 being the second layer from the bottom (a height adjacent to the insulating layer 49).

Figure 19:
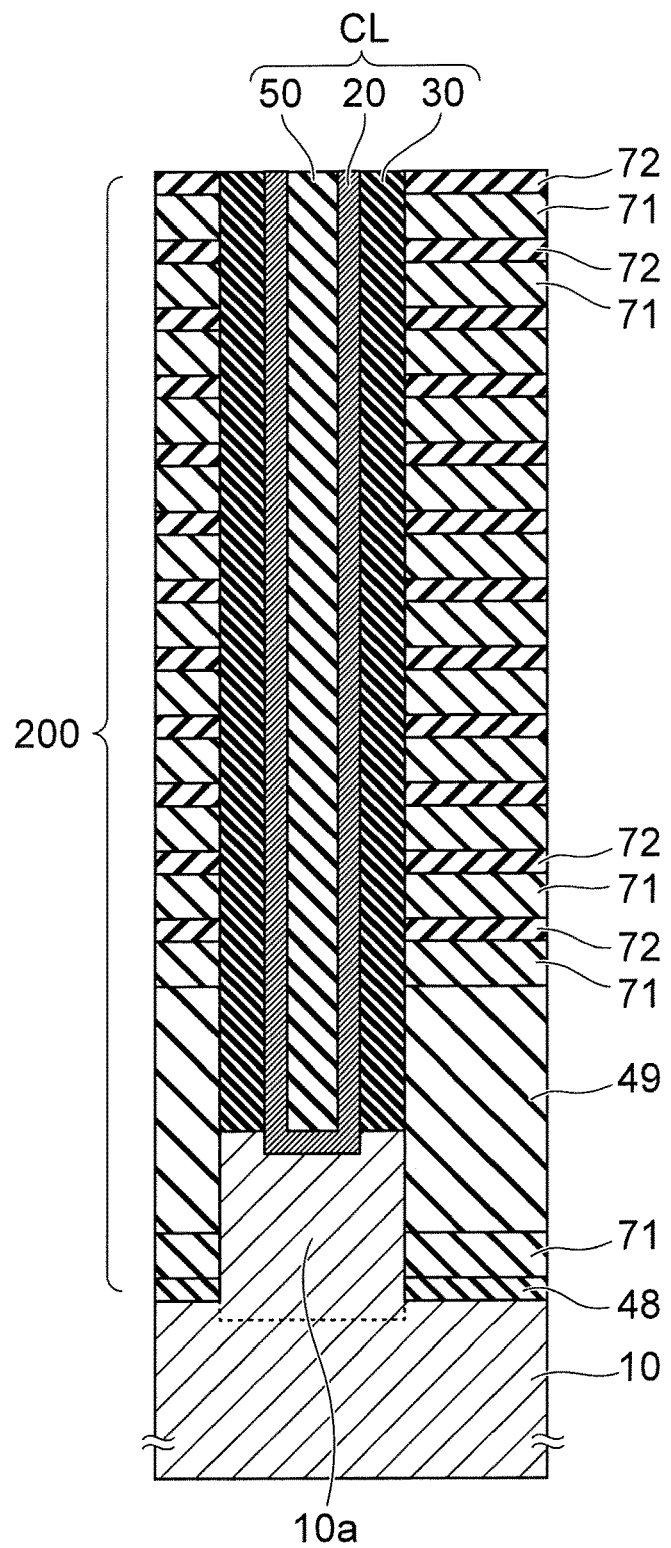

Thereafter, as sown in FIG. 19, a columnar portion CL is formed in the memory hole MH on the convex portion 10a. In the memory hole MH, a memory film 30, a semiconductor body 20, and a core film 50 are formed sequentially. A lower end portion of the semiconductor body 20 is in contact with the convex portion 10a of the substrate 10.

Figure 20:
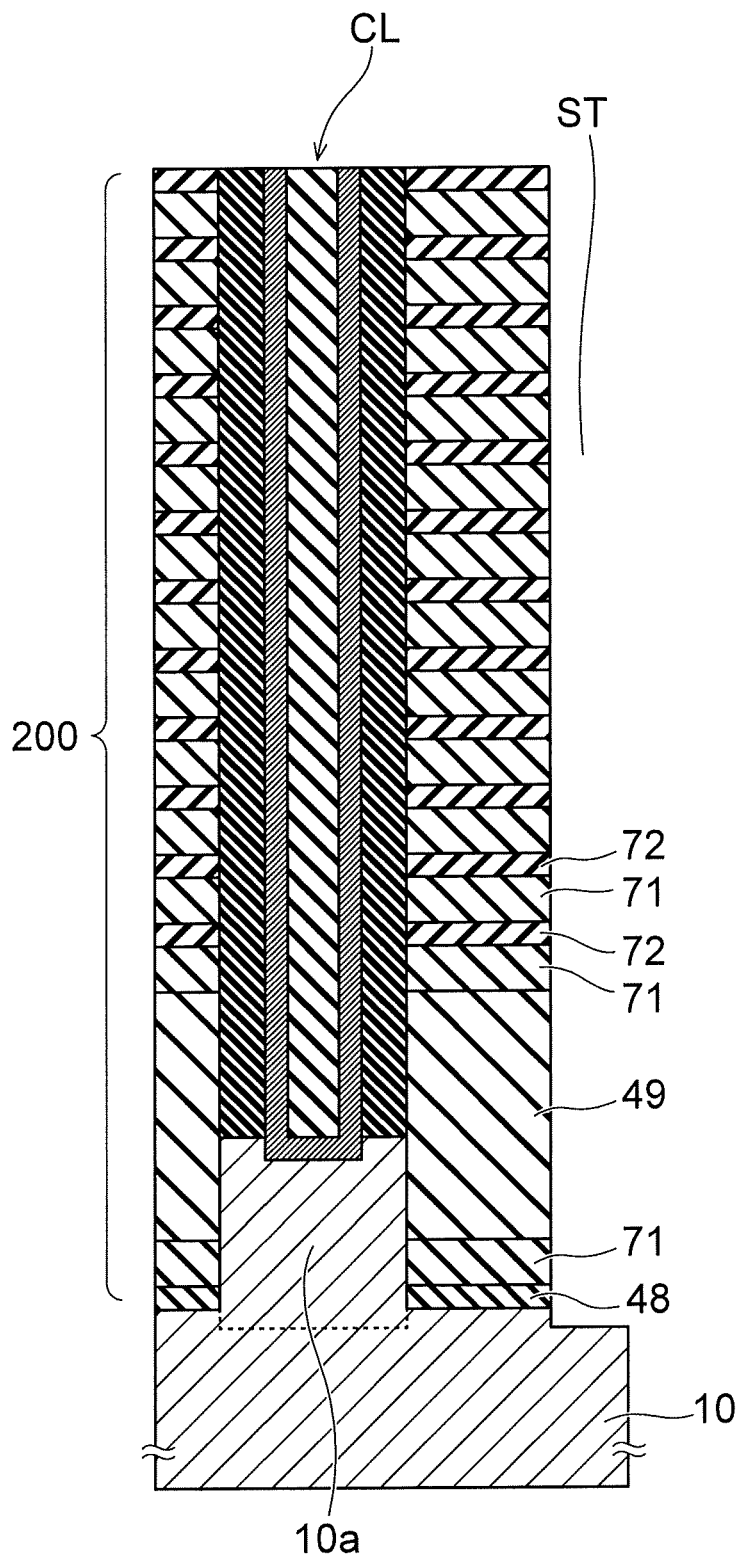

After forming the columnar portion CL, a slit ST is formed in the stacked body 200 as shown in FIG. 20. The slit ST is formed by an RIE method using a mask layer (not shown). The slit ST pierces the stacked body 200 to reach the surface of the substrate 10.

Then, the sacrifice layer 71 is removed by etching through the slit ST. For example, the sacrifice layer 71 which is a silicon nitride layer is removed by a wet method using $H_3PO_4$.

Figure 21:
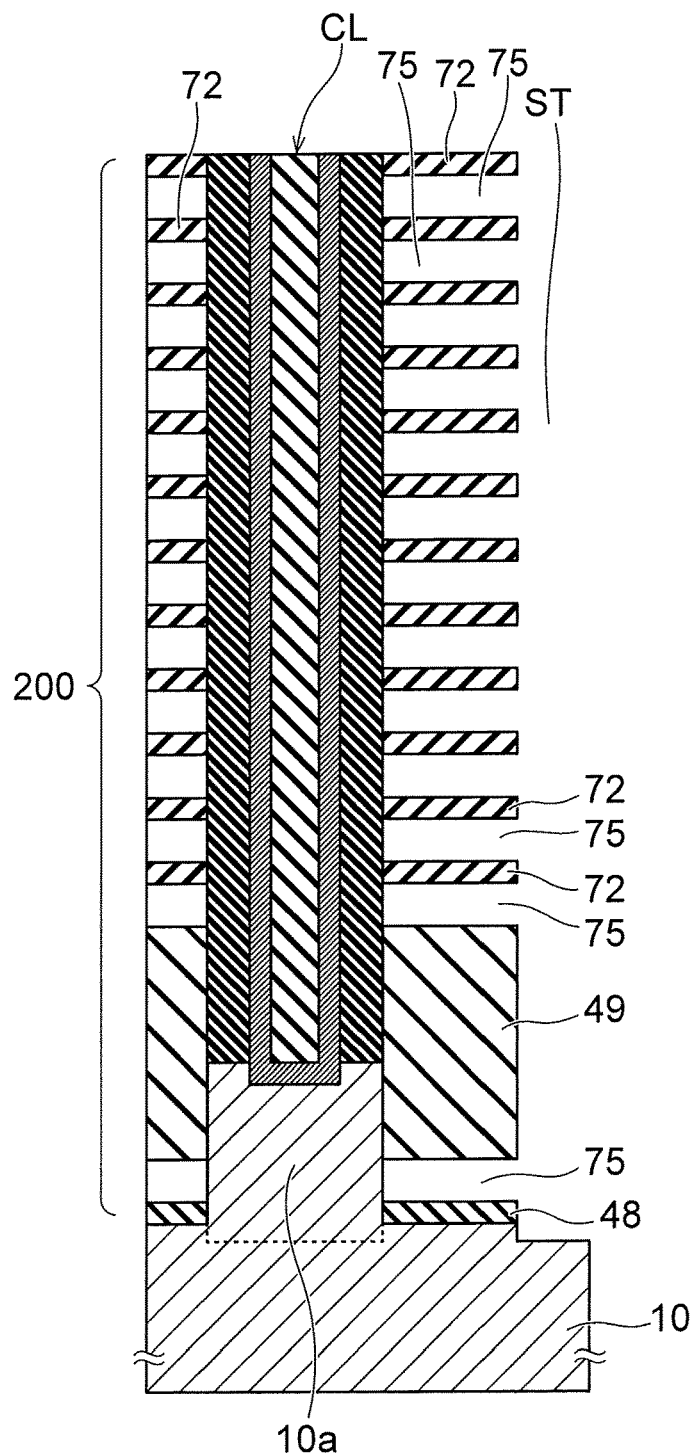

By removing the sacrifice layer 71, an air gap 75 is formed between the plurality of insulating layers 72 as shown in FIG. 21. The air gap 75 is also formed between the insulating layer 48 and the insulating layer 49, and between the insulating layer 49 and the insulating layer 72 thereabove.

Figure 22:
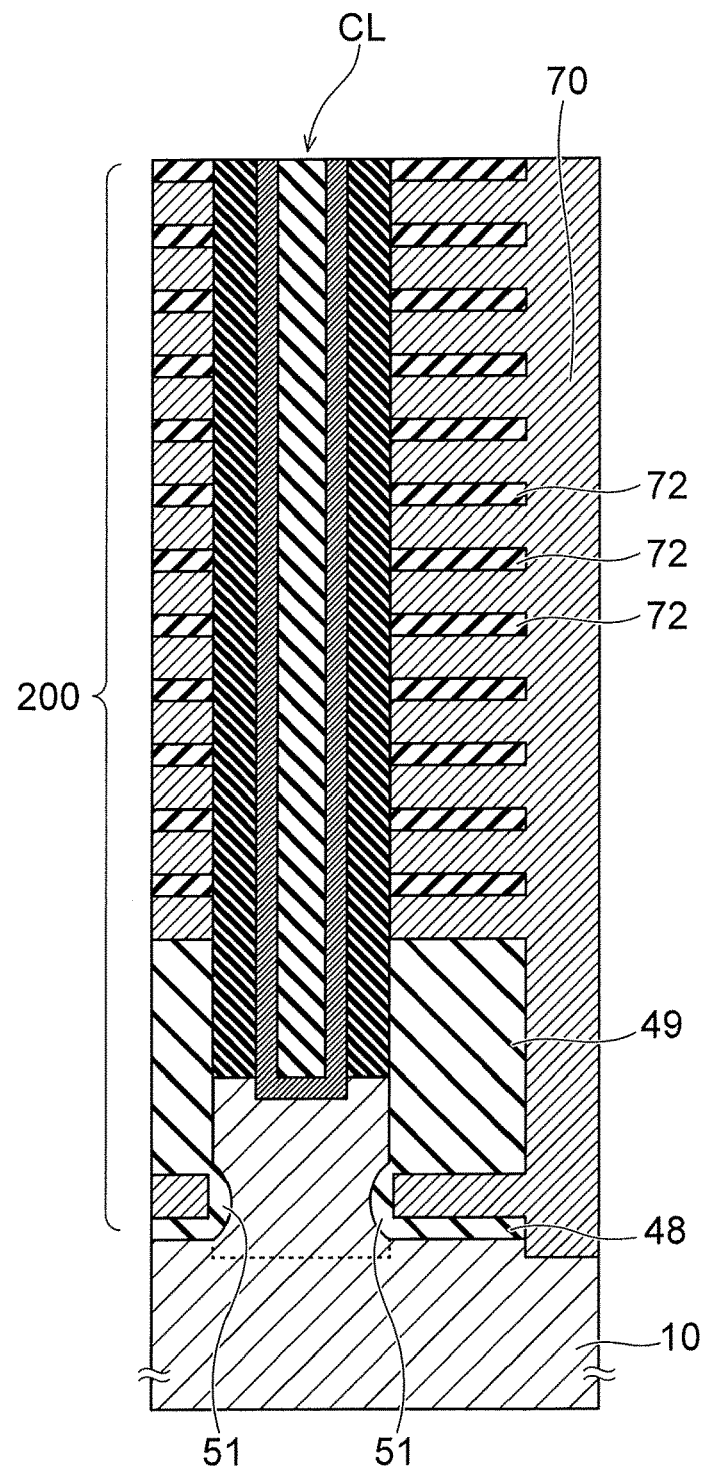

In the air gap 75 between the insulating layer 48 and the insulating layer 49, a side surface of the convex portion 10a of the substrate 10 is exposed. Then, the atmosphere inside the air gap 75 is changed to an oxidizing atmosphere through the slit ST, and the side surface of the convex portion 10a is oxidized. As shown in FIG. 22, a silicon oxide film is formed as the insulating film 51 on the side surface of the convex portion 10a.

After this oxidizing treatment of the side surface of the convex portion 10a, as shown in FIG. 22, a conductive layer 70 is formed in the air gap 75. As the conductive layer 70, for example, a tungsten layer is formed by a CVD method. A source gas is supplied to the air gap 75 through the slit ST.

A material film of the conductive layer 70 is also formed on a side wall of the slit ST. The material film of the conductive layer 70 formed on the side wall of the slit ST is removed by etching using a gas or a liquid supplied to the slit ST.

Figure 23:
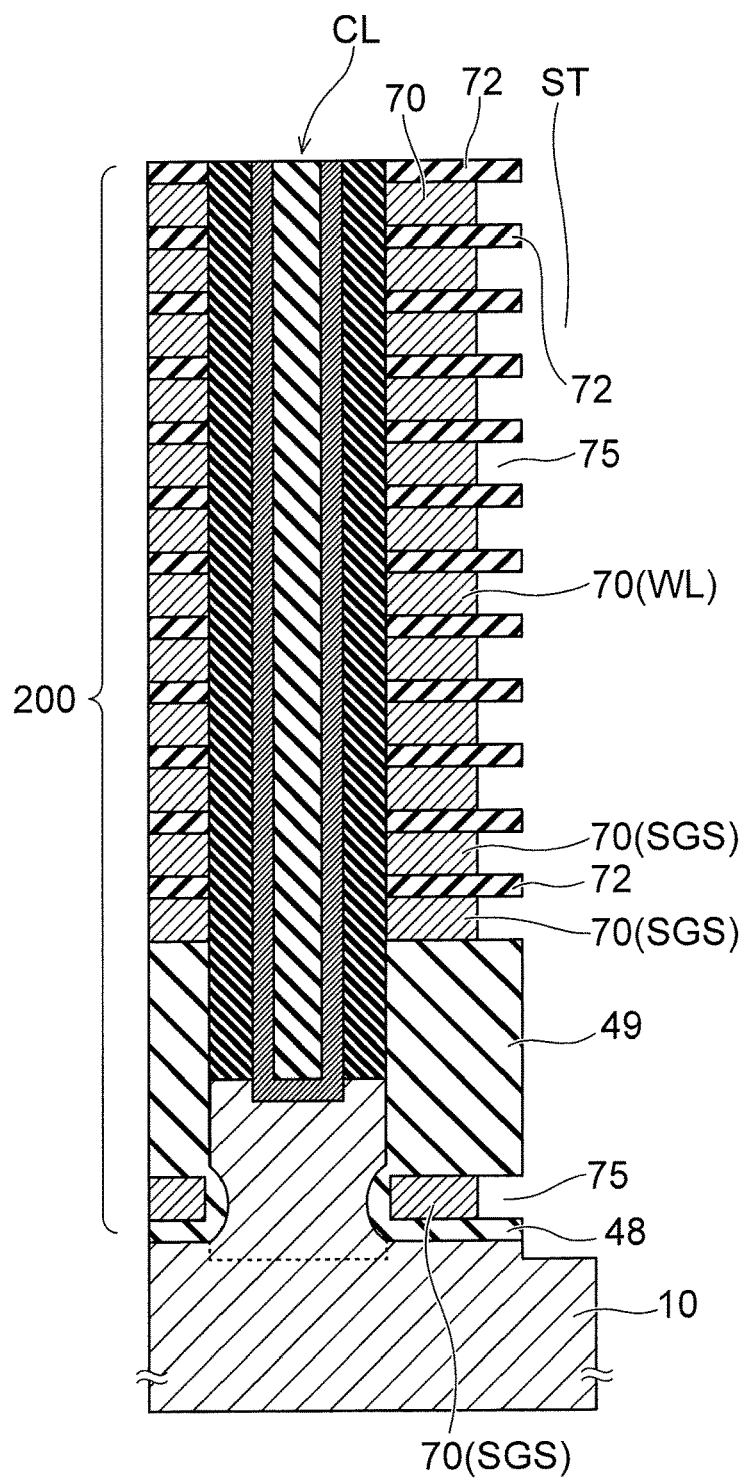

As shown in FIG. 23, the conductive layers 70 of the respective layers are separated from each other. Further, an end face on a side of the slit ST of the conductive layer 70 is retreated from an end face on a side of the slit ST of the insulating layer 72, and the air gap 75 is formed between the insulating layers 72 adjacent to each other in the stacking direction. The air gap 75 is also formed between the insulating layer 72 and the insulating layer 49, and between the insulating layer 49 and the insulating layer 48.

Figure 24:
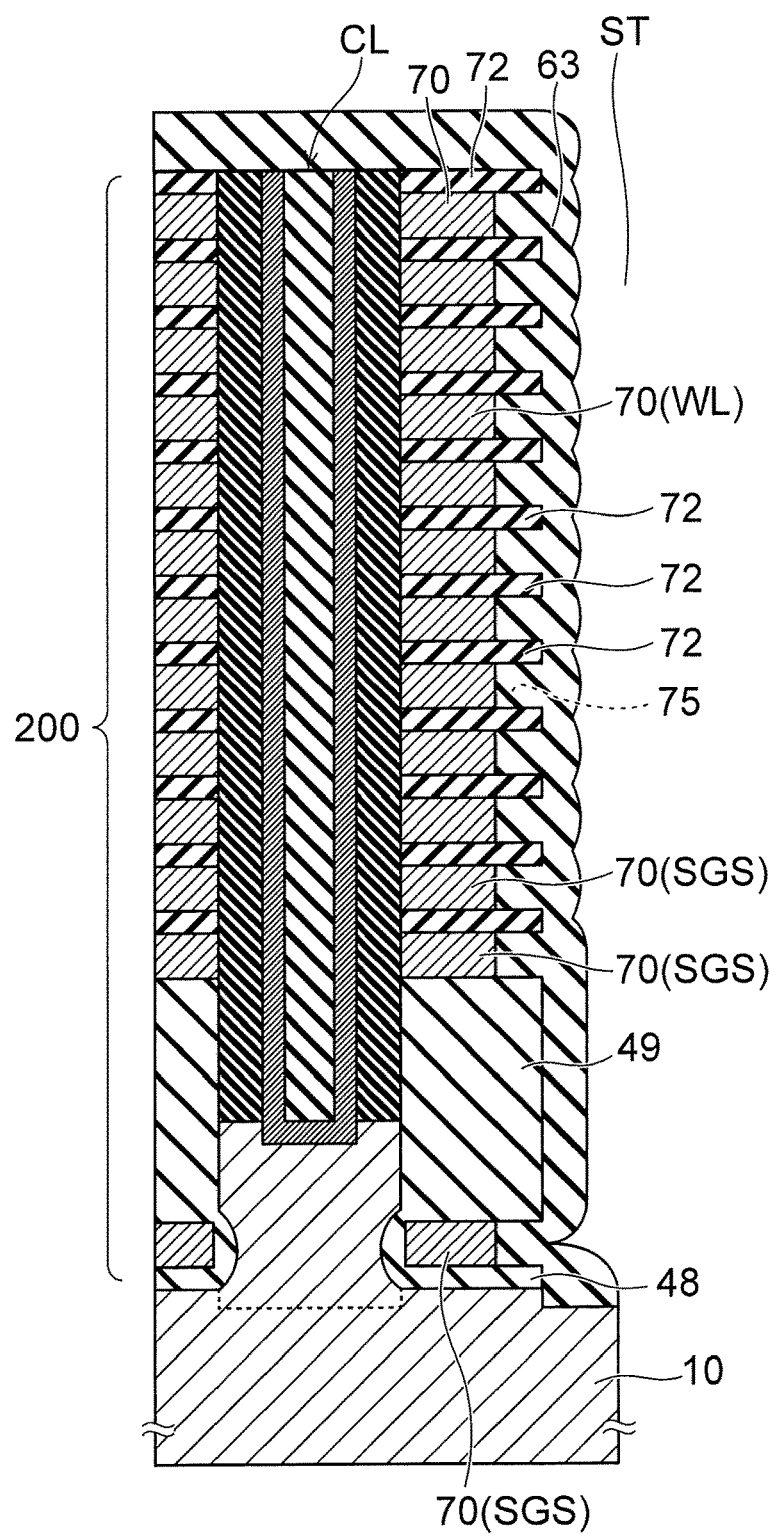

In the air gap 75, a cap film 63 shown in FIG. 24 is formed. The cap film 63 is, for example, a silicon nitride film. The cap film 63 is formed conformally along the upper surface of the stacked body 200, and the side wall and the bottom of the slit ST.

The cap film 63 covers an end portion on a side of the slit ST of the insulating layer 72. Further, the cap film 63 covers an end portion (side surface) on a side of the slit ST of the insulating layer 49 and an end portion on a side of the slit ST of the insulating layer 48.

Figure 25:
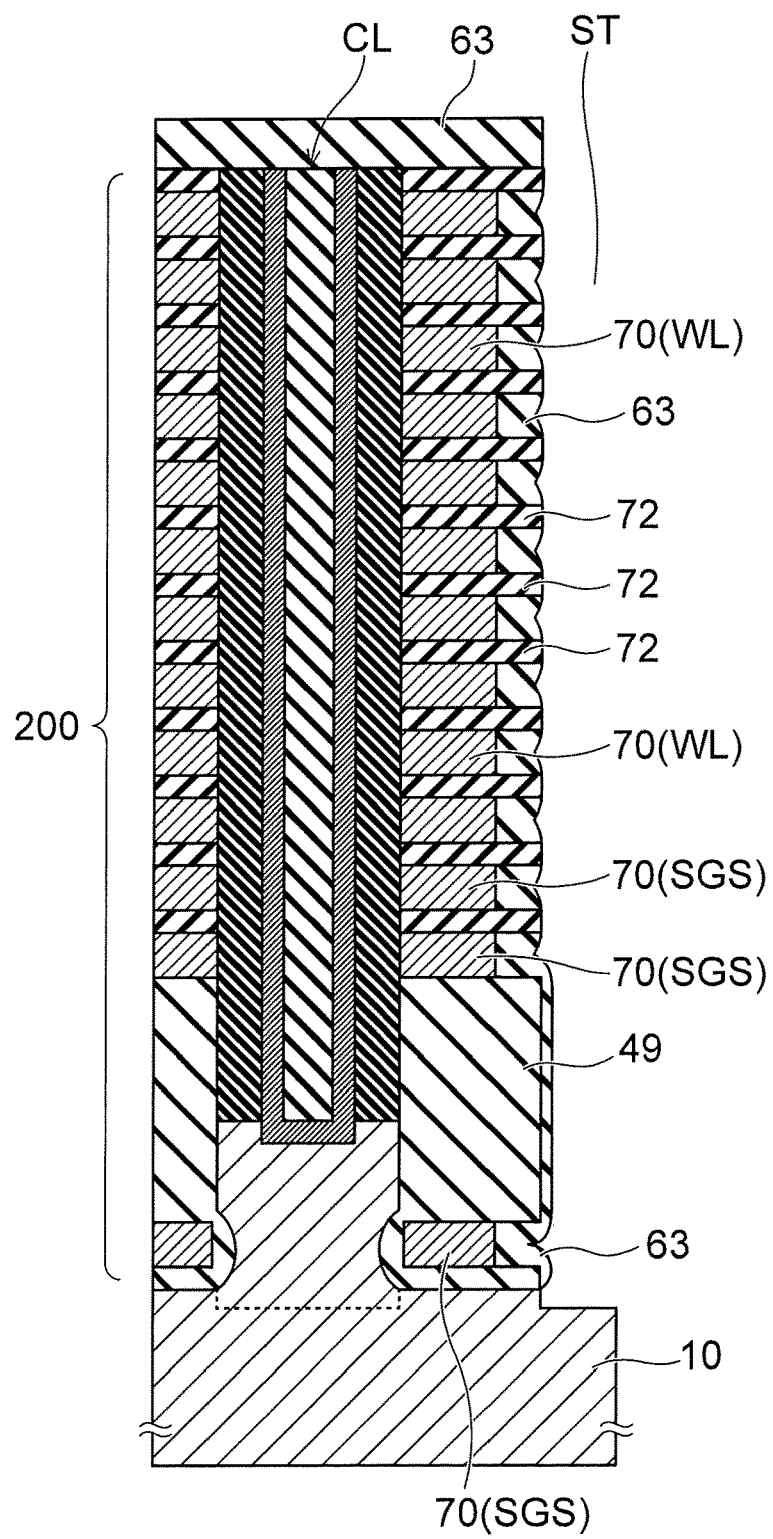

Subsequently, etching of the cap film 63 is allowed to proceed, and as shown in FIG. 25, the end portion of the insulating layer 72 is exposed to the slit ST. The cap film 63 covering the end portion of the conductive layer 70 is left. On the side surface of the insulating layer 49, the cap film 63 may be left thin as shown in FIG. 25, or the side surface of the insulating layer 49 may be exposed to the slit ST.

Figure 26:
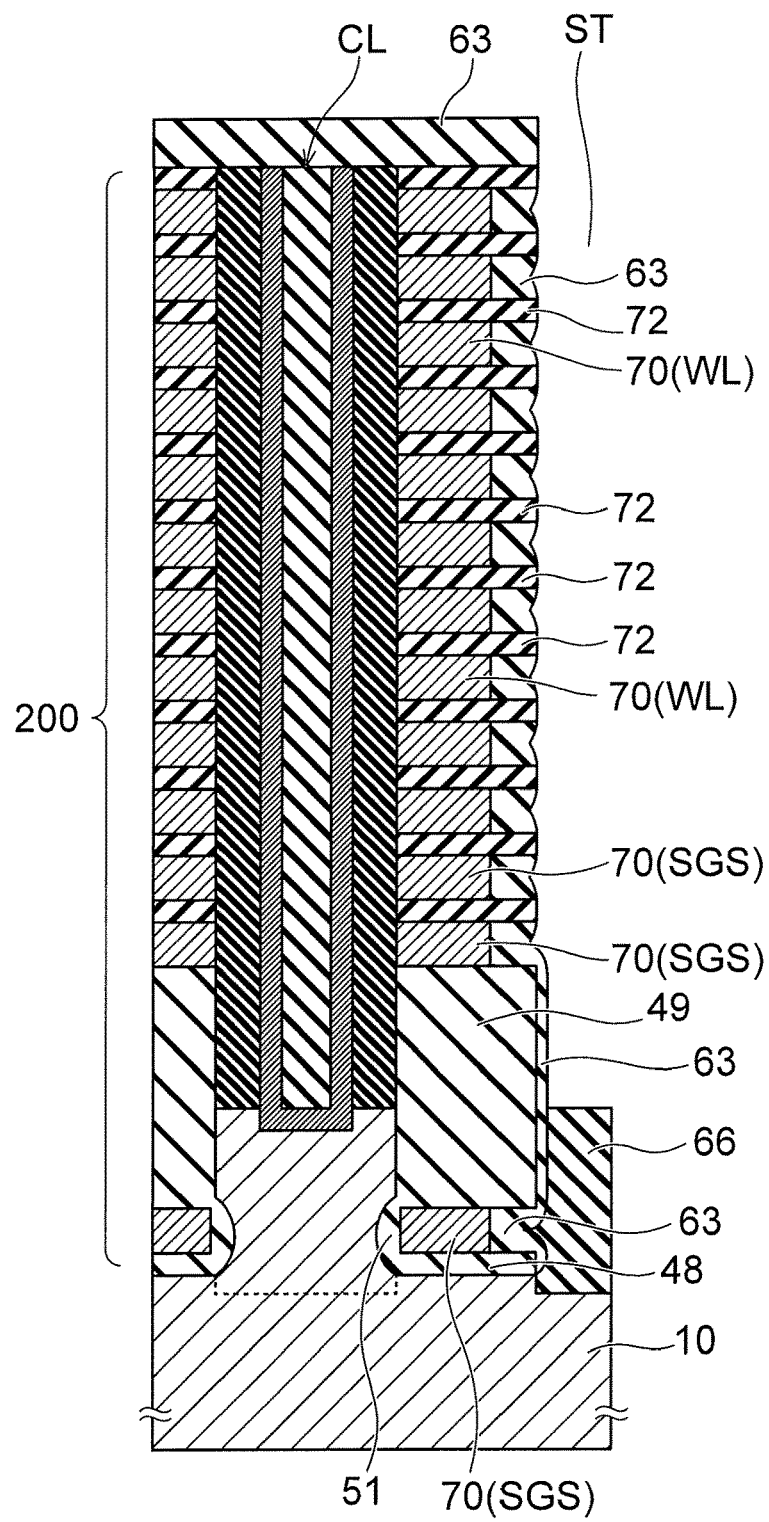

The cap film 63 on the bottom of the slit ST is removed. On a surface of the substrate 10 exposed to the bottom of the slit ST, a cover film 66 is formed as shown in FIG. 26. As the cover film 66, for example, by a bottom-up growth method, a silicon oxide film is grown upward from the bottom of the slit ST.

The cover film 66 is grown to at least a height so as to cover a lateral side of the insulating layer 48 between the surface of the substrate 10 and the lowermost source-side select gate SGS. In the example shown in FIG. 26, an upper end of the cover film 66 is positioned at a height between the lowermost insulating layer 72 and the lowermost conductive layer 70 (source-side select gate SGS). The upper end of the cover film 66 is positioned on a lateral side of the insulating layer 49. The cover film 66 does not cover the end portion of the insulating layer 72 exposed to the slit ST.

After forming the cover film 66, the insulating layer 72 is removed. Etching of the insulating layer 72 proceeds from the end portion exposed to the slit ST by supplying an etching gas or an etching liquid to the slit ST.

Figure 27:
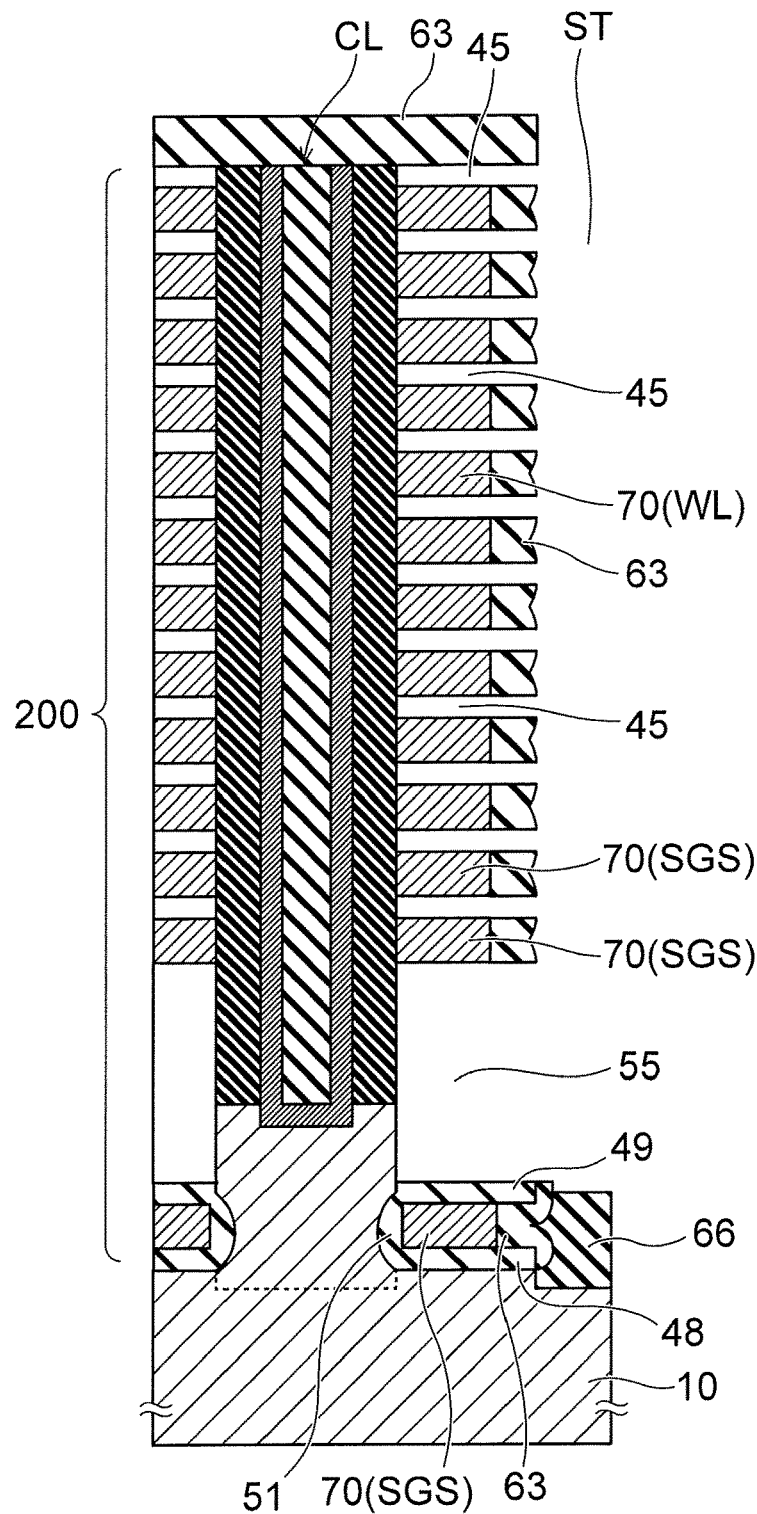

As shown in FIG. 27, the air gap 45 is formed between the plurality of conductive layers 70 excluding the lowermost conductive layer (source-side select gate SGS) 70. The air gap 45 is also formed between the uppermost conductive layer 70 and the cap film 63 on the upper surface of the stacked body 200.

Depending on the etching selection ratio between the insulating layer 72 and the cap film 63 or the etching conditions, a pin hole is formed in the cap film 63 left thin on the side surface of the insulating layer 49 in FIG. 26, and also etching of the insulating layer 49 of a silicon oxide-based material which is the same as that of the insulating layer 72 proceeds starting from the pin hole.

On a lateral side on a side of the slit ST of the insulating layer 49, the cover film 66 is provided to a height in the middle of the insulating layer 49. Further, the insulating layer 49 is sufficiently thicker than the insulating layer 72. Therefore, even if the insulating layer 49 is etched while etching the insulating layer 72, a part of the insulating layer 49 can be left on the lowermost source-side select gate SGS as shown in FIG. 27. Between the left insulating layer 49 and the conductive layer 70 thereabove, an air gap 55 is formed.

Also the upper surface of the cover film 66 of a silicon oxide-based material which is the same as that of the insulating layer 72 is gradually retreated while etching the insulating layer 72. However, at the starting time point of etching, as shown in FIG. 26, at least a lateral side on a lower layer side of the insulating layer 49 is covered with the cover film 66, and therefore, etching from a lateral direction of the insulating layer 49 in a region adjacent to the upper surface of the lowermost conductive layer 70 (source-side select gate SGS) can be suppressed.

In order to prevent the cover film 66 from disappearing before the insulating layer 72 is completely removed, in the example shown in FIG. 27, after the insulating layer 72 is removed, an upper end of the cover film 66 is positioned in a vicinity of a lateral side of the insulating layer 49 left on the lowermost conductive layer 70.

Also an end portion on a side of the slit ST of the insulating layer 48 between the lowermost conductive layer 70 and the surface of the substrate 10 is covered with the cover film 66, and therefore, also the insulating layer 48 is not etched from a lateral direction.

Further, by leaving the insulating layers 49 and 48 on the upper surface and the lower surface of the lowermost conductive layer 70, penetration of an etching gas or an etching liquid into a region between the side surface of the convex portion 10a of the substrate 10 and the lowermost conductive layer 70 is also suppressed, and the insulating film 51 can be left between the side surface of the convex portion 10a and the lowermost conductive layer 70. The lowermost conductive layer 70 is stably supported by physical bonding to the substrate 10 with the insulating layers 48 and 49 and the insulating film 51 interposed.

When the insulating layer 48 and the insulating film 51 are half-etched and partially left, leakage may occur between the source-side select gate SGS and the convex portion 10a or between the source-side select gate SGS and the surface of the substrate 10 through an end face of the left portion. Further, partial etching of the insulating layer 48 and the insulating film 51 causes a variation in the threshold voltage of the source-side select transistor.

However, according to the embodiment, a state where the insulating layer 48 and the insulating film 51 are interposed between the source-side select gate SGS and the substrate 10 with no air gap can be maintained, and therefore, a high breakdown voltage between the source-side select gate SGS and the substrate 10 can be ensured. Further, a stable threshold voltage of the source-side select transistor is obtained.

By a gate potential to be applied to the lowermost conductive layer 70, that is, the lowermost source-side select gate SGS, a channel (inversion layer) is induced or a channel is cut-off in a side surface of the convex portion 10a opposed to a side surface of the source-side select gate SGS, and a surface of the substrate 10 opposed to a lower surface of the source-side select gate SGS.

It is desirable for channel controllability at that time to place not an air gap, but an insulating film having a higher dielectric constant than the air gap between the lowermost source-side select gate SGS and the side surface of the convex portion 10a and between the lowermost source-side select gate SGS and the surface of the substrate 10.

According to the embodiment, after the insulating layer 72 is removed, as shown in FIG. 27, the insulating film (the insulating body) can be reliably left on the upper surface, the lower surface, and the side surface on a side of the convex portion 10a, of the lowermost source-side select gate SGS.

The cap film 63 formed on the end portion on a side of the slit ST of the conductive layer 70 prevents etching damage to the end portion of the conductive layer 70 during etching of the insulating layer 72.

Figure 28:
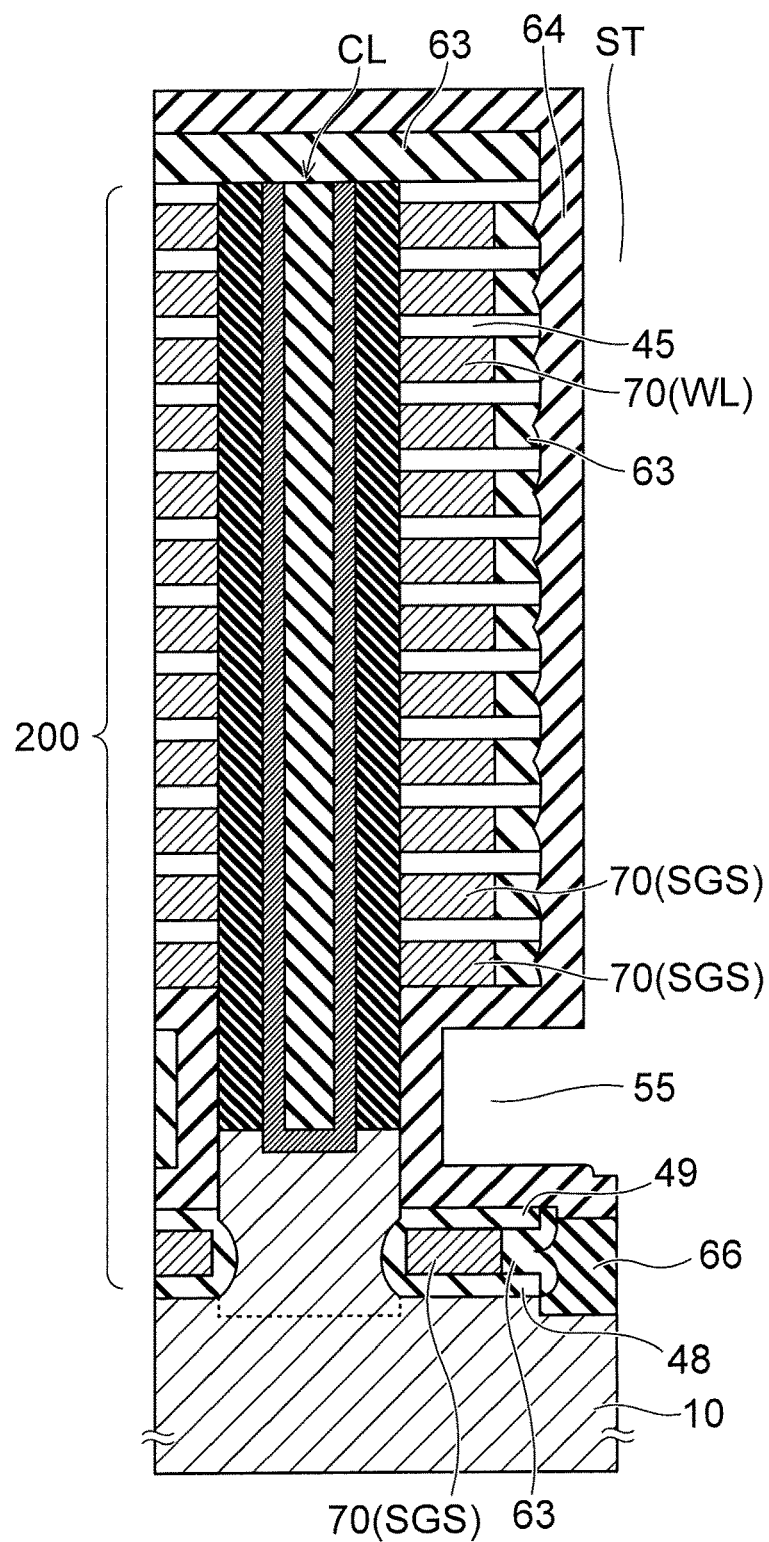

After forming the air gaps 45 and 55, the insulating film (the insulating body) 64 is formed on the side wall of the slit ST as shown in FIG. 28. The insulating film 64 closes the end portion on a side of the slit ST of the air gap 45. Further, the insulating film 64 covers the cap film 63 exposed to the slit ST.

With respect to the air gap 55 having a larger size in a height direction than the air gap 45, the insulating film 64 is formed conformally along the inner wall of the air gap 55. The side surface of the convex portion 10a of the substrate 10 exposed to the air gap 55 is covered with the insulating film 64.

The insulating film 64 is also formed on the insulating layer 49 and on the cover film 66 left on the bottom of the slit ST.

Figure 29:
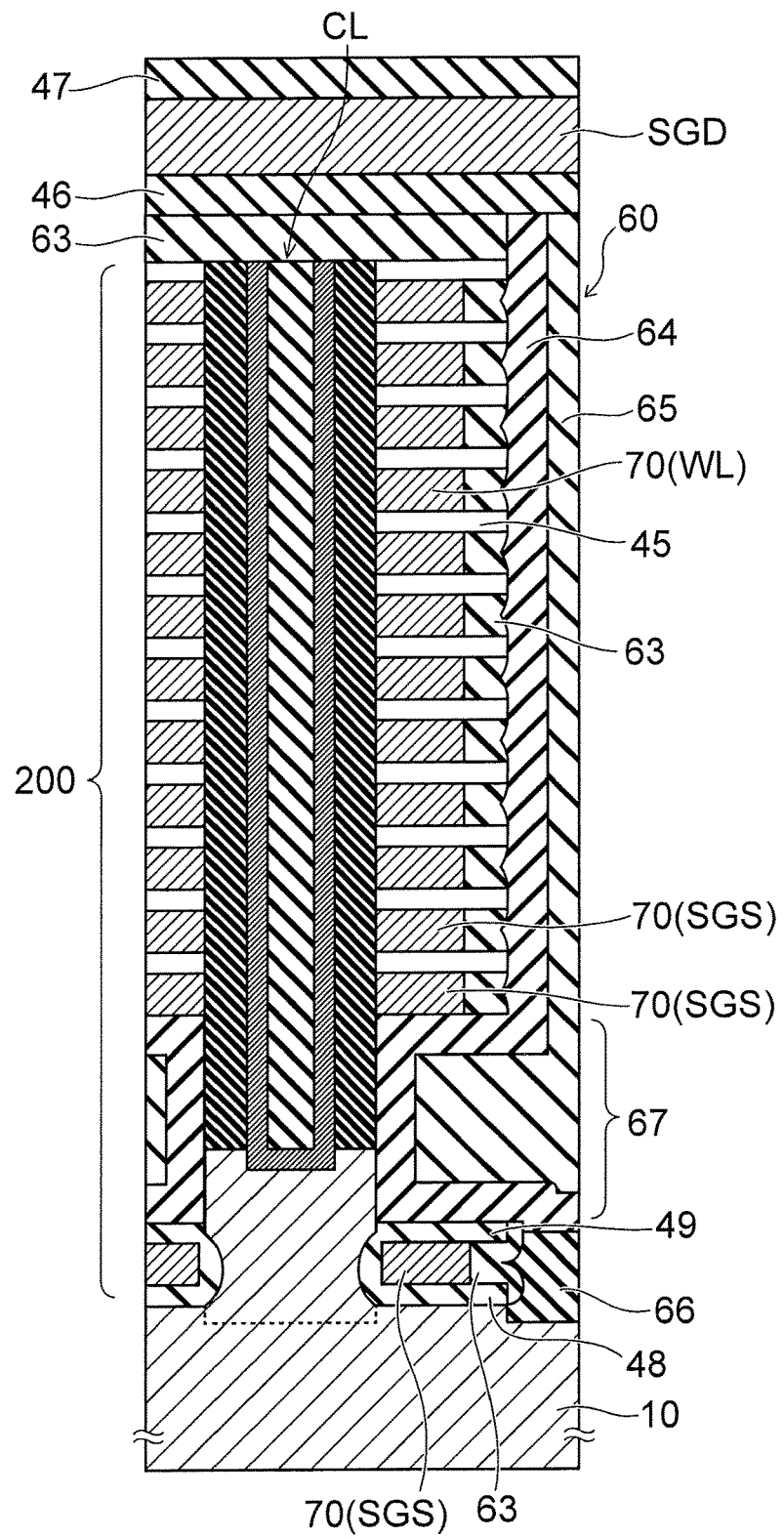

After forming the insulating film 64, the insulating film (the insulating body) 65 shown in FIG. 29 is formed in the slit ST. After forming the insulating film 65, an interconnect portion (not shown) reaching the surface of the substrate 10 is formed in the slit ST, and the dividing portion 60 is formed. Alternatively, the dividing portion 60 may be formed only from an insulating material.

In the process shown in FIG. 27, even if the insulating layer 49 on the upper surface of the lowermost source-side select gate SGS is removed, in the processes shown in FIGS. 28 and 29, the insulating layer 67 can be formed on the upper surface of the lowermost source-side select gate SGS.

On the stacked body 200 and on the dividing portion 60, the insulating layer 46 is formed as shown in FIG. 29. On the insulating layer 46, as the drain-side select gate SGD, for example, a polycrystalline silicon layer doped with an impurity is formed. On the drain-side select gate SGD, the insulating layer 47 is formed. In the example shown in FIG. 29, the cap film 63 is left between the stacked body 200 and the insulating layer 46.

Figure 30A:
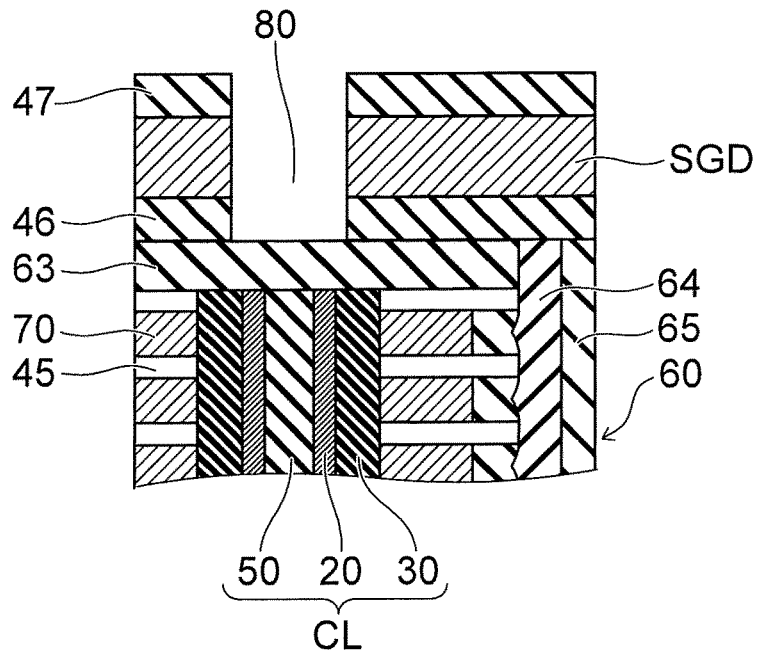
FIG. 30A to FIG. 31B are schematic sectional views showing a method for manufacturing the semiconductor device of the embodiment.

As shown in FIG. 30A, a hole 80 is formed in the insulating layer 47, the drain-side select gate SGD, and the insulating layer 46. The hole 80 pierces through the insulating layer 47, the drain-side select gate SGD, and the insulating layer 46 to reach the cap film 63. The hole 80 is formed just above the columnar portion CL.

Figure 30B:
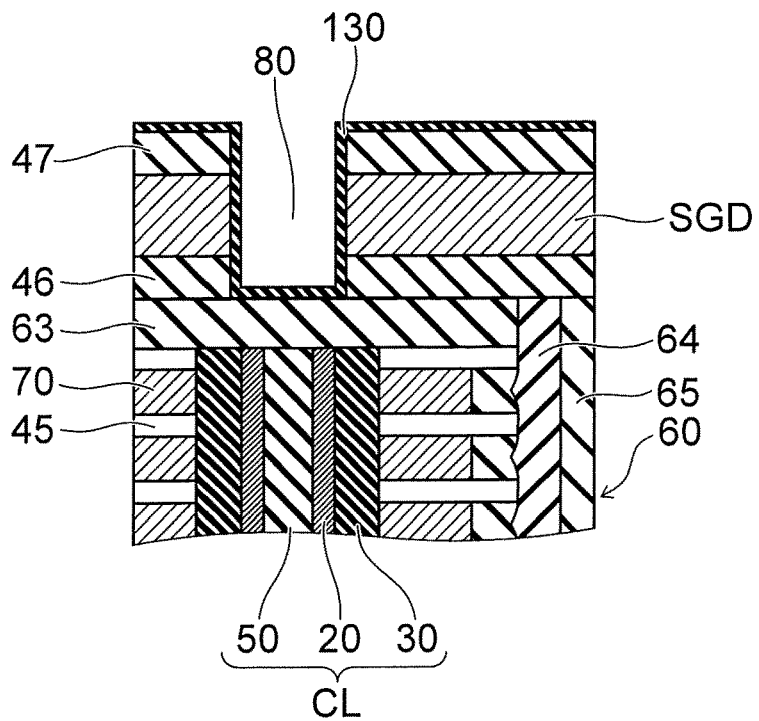
Figure 31A:
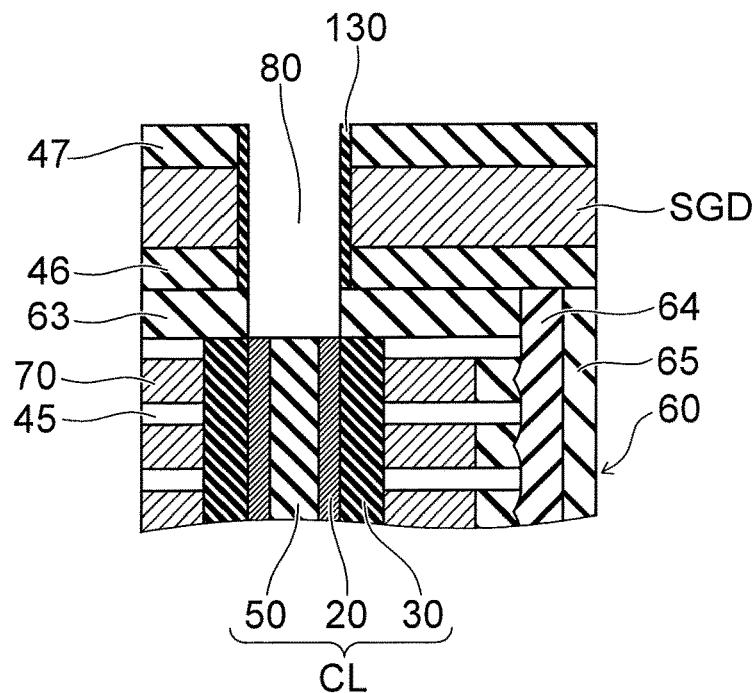

On a side wall and a bottom of the hole 80, a gate insulating film 130 is formed as shown in FIG. 30B. The gate insulating film 130 on the bottom of the hole 80 is removed by, for example, an RIE method, and further, as shown in FIG. 31A, also the cap film 63 below the bottom of the hole 80 is removed.

Figure 31B:
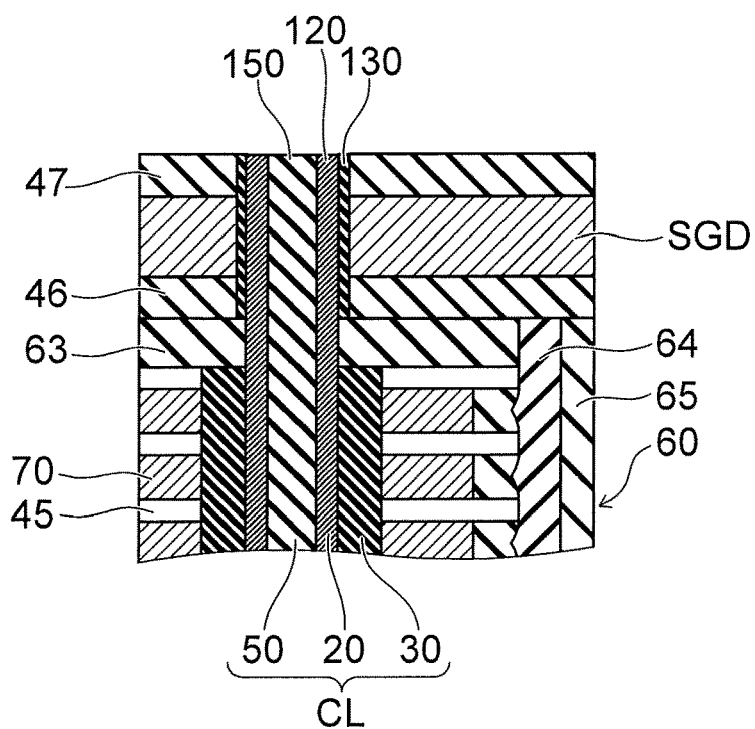

An upper end of the semiconductor body 20 of the columnar portion CL is exposed to the bottom of the hole 80. Thereafter, on a side surface of the gate insulating film 130 formed on the side wall of the hole 80, a semiconductor body 120 is formed as shown in FIG. 31B. A lower end of the semiconductor body 120 is connected to the upper end of the semiconductor body 20. Inside the semiconductor body 120, a core film 150 is formed.

Figure 32:
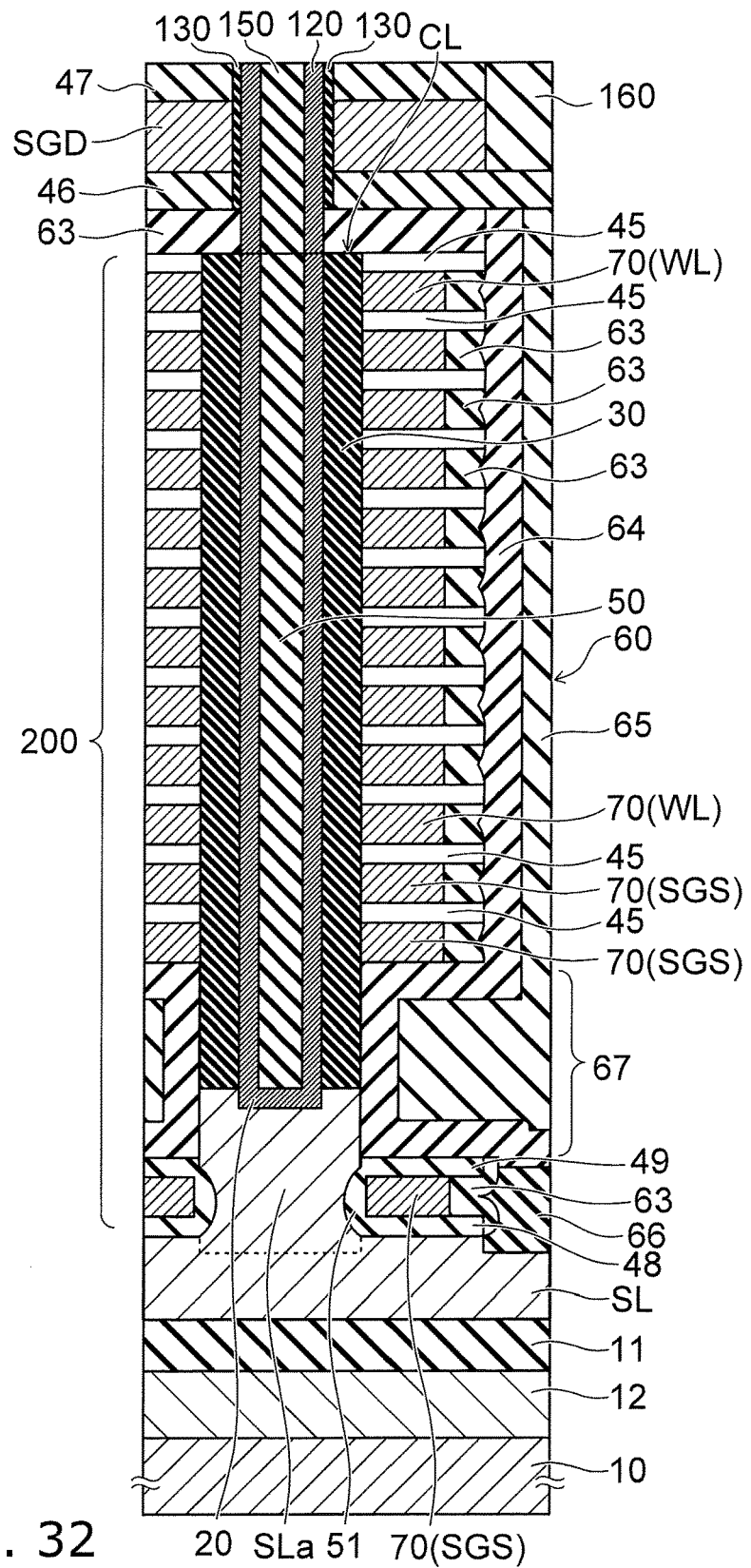
FIG. 32 is a schematic sectional view of a semiconductor device of the embodiment.

FIG. 32 is a schematic sectional view showing another structural example of the semiconductor device shown in FIG. 15.

A circuit layer 12 is provided on a substrate 10, an insulating layer 11 is provided on the circuit layer 12, and a source layer SL is provided on the insulating layer 11. The circuit layer 12 includes, for example, a CMOS circuit.

In the example shown in FIG. 32, in place of the substrate 10 shown in FIG. 15, the source layer SL is provided as a foundation layer. The source layer SL is, for example, a polycrystalline silicon layer doped with an impurity. The source layer SL includes a convex portion SLa as a component corresponding to the convex portion 10*a* of the substrate 10 shown in FIG. 15.

A columnar portion CL is provided on the convex portion SLa, and a lower end portion of a semiconductor body 20 is in contact with the convex portion SLa. A memory hole in which the columnar portion CL is to be formed is formed so as to reach the source layer SL, and silicon is epitaxially grown on a bottom of the memory hole, whereby the convex portion SLa is formed.

Figure 33:
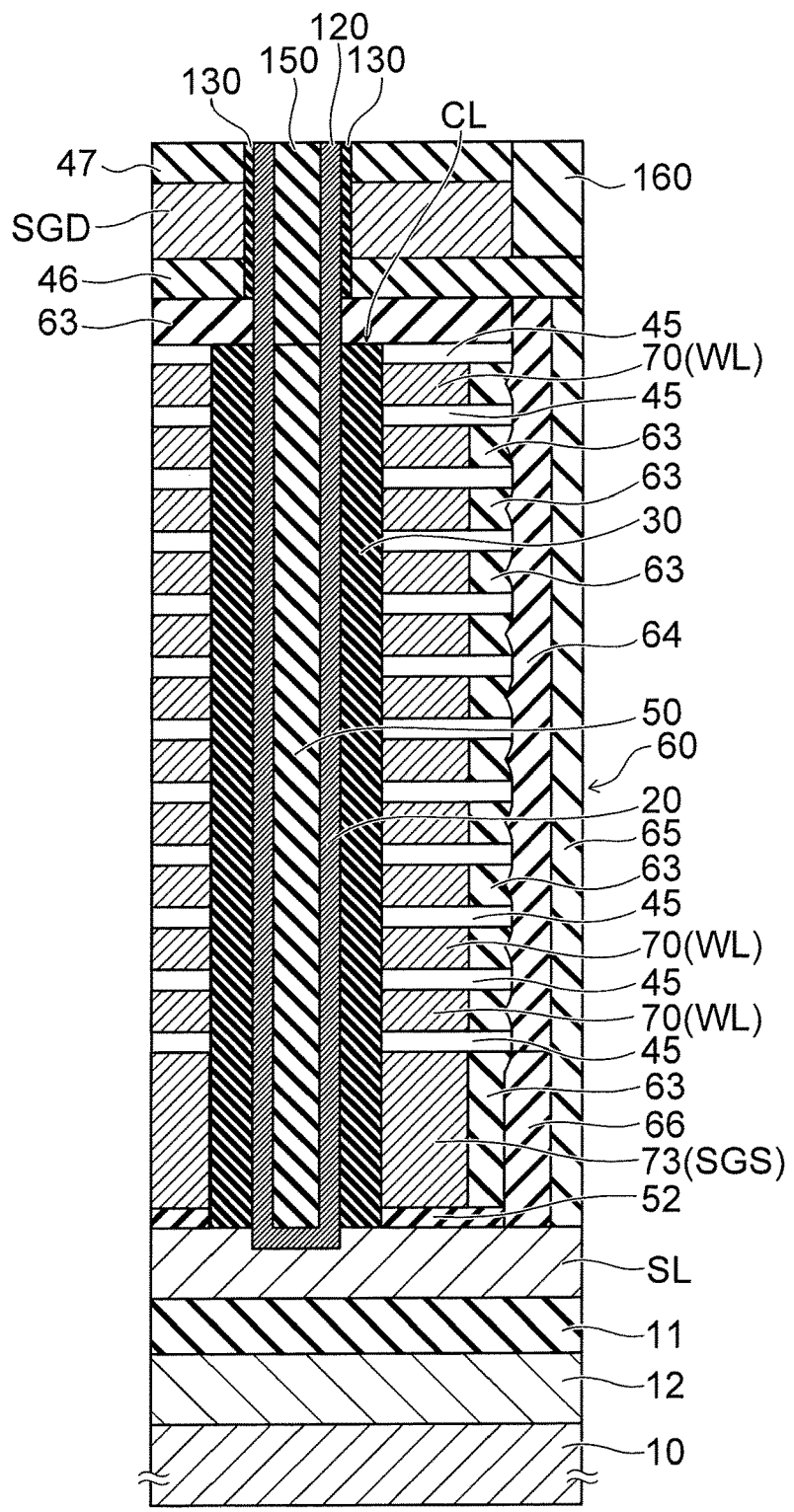
FIG. 33 is a schematic sectional view of a semiconductor device of the embodiment.

FIG. 33 is a schematic sectional view showing still another structural example of the semiconductor device shown in FIG. 15.

Also in the example shown in FIG. 33, in the same manner as in FIG. 32, a circuit layer 12 is provided on a substrate 10, an insulating layer 11 is provided on the circuit layer 12, and a source layer SL is provided on the insulating layer 11. A lower end portion of a semiconductor body 20 is in contact with the source layer SL.

An insulating layer (a lowermost second film) 52 is provided on the source layer SL, and one layer of a thick conductive layer (a lowermost first film) 73 is provided on the insulating layer 52 as a source-side select gate SGS. A plurality of electrode layers WL stacked with the air gap 45 interposed is provided on the conductive layer 73. The air gap 45 is formed between the lowermost electrode layer WL and the conductive layer 73 (source-side select gate SGS).

The conductive layer 73 (source-side select gate SGS) is, for example, a polycrystalline silicon layer doped with an impurity and is thicker than the thickness of one layer of the electrode layers WL.

A cover film 66 is provided on a lateral side on a dividing portion 60 side of the conductive layer 73 (source-side select gate SGS). A cap film 63 is provided between the cover film 66 and a side surface of the conductive layer 73 (source-side select gate SGS). The cover film 66 is also provided on a lateral side of the insulating layer 52. In the same process as in the above-mentioned FIG. 25, the cap film 63 is left between the insulating layer 52 and the cover film 66 in some cases.

The cover film 66 is formed by a bottom-up growth method in the same manner as the process shown in FIG. 26. That is, the cover film 66 is formed on the source layer SL on the bottom of the slit ST. Thereafter, an insulating layer 72 is removed by etching through the slit ST, whereby the air gap 45 is formed.

In this etching, an end portion on a side of the slit ST of the insulating layer 52 is protected by being covered with the cover film 66, and thus, the insulating layer 52 is not etched. Therefore, the insulating layer 52 is not half-etched, and the insulating layer 52 can be left in the entire region between the conductive layer 73 (source-side select gate SGS) and the source layer SL. This increases a breakdown voltage between the conductive layer 73 (source-side select gate SGS) and the source layer SL. Further, a stable threshold voltage of the source-side select transistor is obtained.

Figure 34:
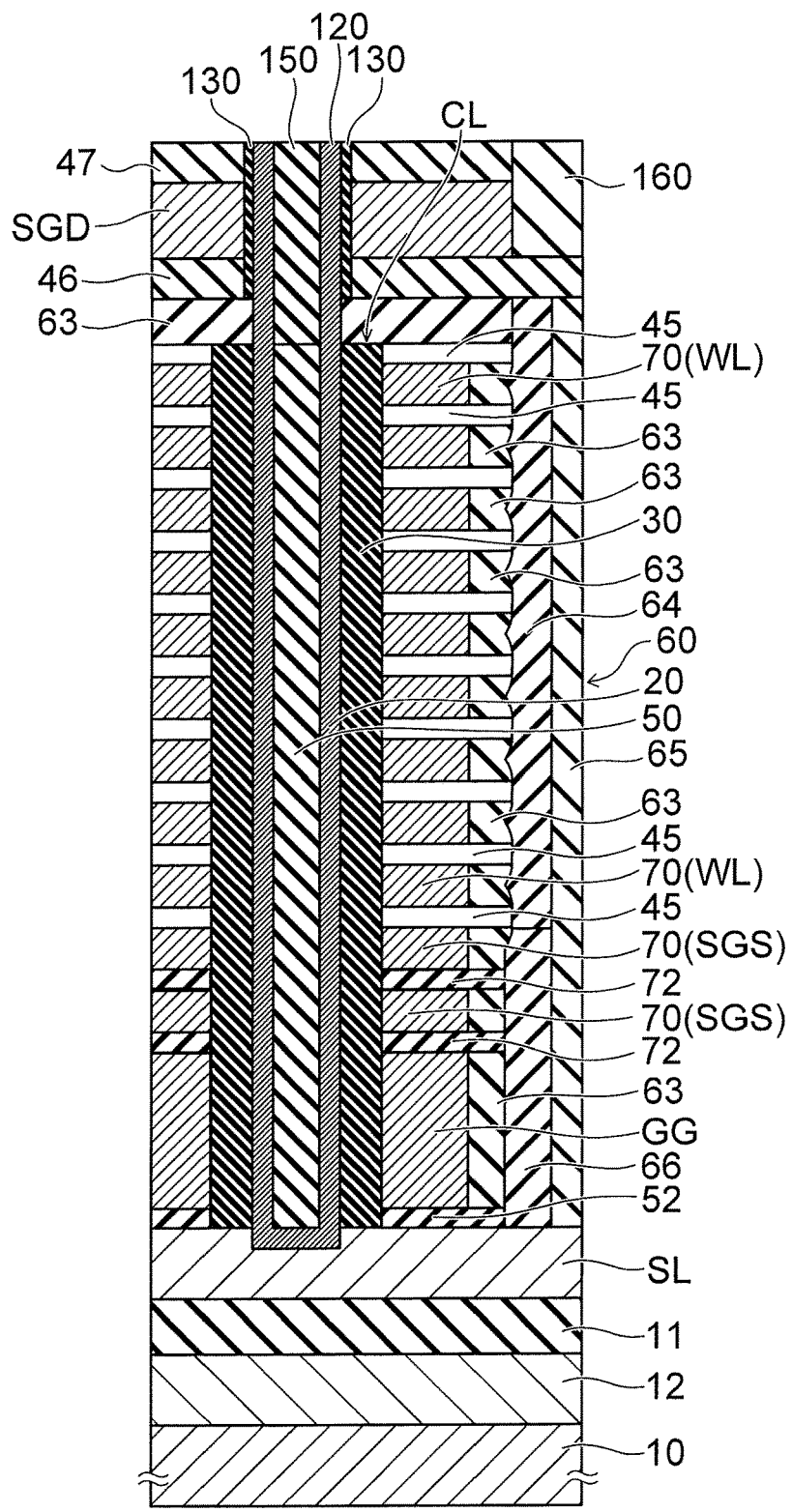
FIG. 34 is a schematic sectional view of a semiconductor device of the embodiment.

FIG. 34 is a schematic sectional view showing still another structural example of the semiconductor device shown in FIG. 15.

Also in the example shown in FIG. 34, in the same manner as in FIG. 32 and FIG. 33, a circuit layer 12 is provided on a substrate 10, an insulating layer 11 is provided on the circuit layer 12, and a source layer SL is provided on the insulating layer 11. A lower end portion of a semiconductor body 20 is in contact with the source layer SL.

A conductive layer (a lowermost first film) GG is provided with an insulating layer (a lowermost second film) 52 interposed on the source layer SL. A plurality of (for example, two layers of) source-side select gates SGS is provided on the conductive layer GG. A plurality of electrode layers WL stacked with the air gap 45 interposed is provided on the uppermost source-side select gate SGS. The air gap 45 is formed between the uppermost source-side select gate SGS and the lowermost electrode layer WL.

An insulating layer 72 is provided between the plurality of source-side select gates SGS. Also the insulating layer 72 is provided between the conductive layer GG and the lowermost source-side select gate SGS.

The conductive layer GG is, for example, a polycrystalline silicon layer doped with an impurity, and is thicker than the thickness of one layer of the electrode layers WL and the thickness of one layer of the source-side select gates SGS.

The conductive layer GG functions as a GIDL (gate induced drain leakage) generator in an erasing operation. A hole generated by applying an erasing potential to the conductive layer GG to apply a high electric field to a portion facing the conductive layer GG in the semiconductor body 20, is supplied to a channel of a memory cell MC to increase a channel potential. By setting a potential of the electrode layer WL to, for example, a ground potential (0 V), a hole is injected into a charge storage film 32 with a potential difference between the semiconductor body 20 and the electrode layer WL, and a data erasing operation is performed.

A cover film 66 is provided on a lateral side on a dividing portion 60 side of a portion in which a plurality of source-side select gates SGS, the conductive layer GG, and the insulating layer 52 are stacked. Further, a cap film 63 is provided between the source-side select gate SGS and the cover film 66, and between the conductive layer GG and the cover film 66. Between the insulating layer 52 and the cover film 66, the cap film 63 is left in some cases.

The cover film 66 is formed by a bottom-up growth method in the same manner as the process shown in FIG. 26. That is, the cover film 66 is formed on the source layer SL on the bottom of the slit ST. Thereafter, by etching through the slit ST, the insulating layer 72 is removed, whereby the air gap 45 is formed.

In this etching, the end portions on a side of the slit ST of the insulating layer 72 between the plurality of source-side select gates SGS, and the insulating layer 52 are protected by being covered with the cover film 66, and therefore, the insulating layer 72 between the plurality of source-side select gates SGS, and the insulating layer 52 are left without being etched.

By leaving the insulating layers 72 and 52 partially in the stacked body on the foundation layer (source layer SL), the strength of the stacked body can be increased. The same gate potential is applied to the plurality of source-side select gates SGS, and therefore, a high electric field is not applied between the adjacent source-side select gates SGS, and also a problem such as inter-cell interference does not occur. The conductive layer GG and the source-side select gate SGS are controlled at the same potential.

Further, a variation in the threshold voltage of the source-side select transistor due to half-etching of the insulating layer 72 between the source-side select gates SGS can be prevented.

As the first film in the stacked body 100 shown in FIG. 4, the conductive layer 70 is adopted, but a sacrifice layer may be adopted. The processes are allowed to proceed up to the process shown in FIG. 7 for the stacked body 100 including the sacrifice layer, and thereafter, the sacrifice layer is replaced with the conductive layer 70 through the slit ST. Thereafter, the process shown in FIG. 8 and the subsequent processes are continued.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a foundation layer;
    a stacked body provided above the foundation layer, the stacked body including a plurality of electrode layers stacked with an air gap interposed, a plurality of select gate layers stacked in a stacking direction of the electrode layers, and an insulating body provided between the select gate layers adjacent to each other in the stacking direction, the select gate layers including a plurality of drain-side select gates, the drain-side select gates being provided above an uppermost electrode layer of the electrode layers, and the drain-side select gates being adjacent to each other in the stacking direction with the insulating body interposed;
    a semiconductor body extending in the stacking direction in the stacked body;
    a charge storage portion provided between the semiconductor body and one of the electrode layers; and
    a side wall film provided on a side wall of a portion in a slit, the drain-side select gates and the insulating body being stacked in the portion, the slit dividing the stacked body into a plurality of blocks and being connected to the air gap.

2. The device according to claim 1, further comprising a sealing film which closes an upper end of the slit in a vicinity of an upper end of the side wall film.

3. A semiconductor device, comprising:
    a foundation layer;
    a stacked body provided above the foundation layer, the stacked body including a plurality of electrode layers stacked with an air gap interposed, a plurality of select gate layers stacked in a stacking direction of the electrode layers, and an insulating body provided between the select gate layers adjacent to each other in the stacking direction, the select gate layers including a plurality of source-side select gates, the source-side select gates being provided below a lowermost electrode layer of the electrode layers, and the source-side select gates being adjacent to each other in the stacking direction with the insulating body interposed;
    a semiconductor body extending in the stacking direction in the stacked body;
    a charge storage portion provided between the semiconductor body and one of the electrode layers; and
    a cover film provided on a lateral side of the insulating body in a slit which divides the stacked body into a plurality of blocks.

4. The device according to claim 3, further comprising a drain-side select gate provided above the stacked body, the drain-side select gate being thicker than a thickness of one layer of the electrode layers and a thickness of one layer of the source-side select gates.

5. The device according to claim 3, further comprising an insulating film provided on a lateral side of the stacked body in a slit which divides the stacked body into a plurality of blocks, the insulating film closing an end portion of the air gap.

6. The device according to claim 5, further comprising a cap film provided between a slit side end portion of one of the electrode layers and the insulating film.

7. The device according to claim 3, wherein the stacked body further includes a conductive layer provided between the foundation layer and a lowermost source-side select gate, the conductive layer being thicker than a thickness of one layer of the electrode layers and a thickness of one layer of the select gate layers.

8. A semiconductor device, comprising:
    a foundation layer;
    a stacked body provided above the foundation layer, the stacked body including a plurality of electrode layers stacked with an air gap interposed, a plurality of select gate layers stacked in a stacking direction of the electrode layers, and an insulating body provided between the select gate layers adjacent to each other in the stacking direction;
    a semiconductor body extending in the stacking direction in the stacked body; and
    a charge storage portion provided between the semiconductor body and one of the electrode layers,
    the foundation layer includes a semiconductor region doped with an impurity, and
    the semiconductor body is in contact with the semiconductor region.

9. A method for manufacturing a semiconductor device, comprising:
    forming a stacked body above a foundation layer, the stacked body including a plurality of first films and a plurality of second films, the first films and the second films including a first film and a second film stacked alternately;
    forming a slit which divides the stacked body into a plurality of blocks;
    forming a cover film in the slit such that an upper end of the cover film is positioned at a height not higher than at least an upper surface of the first film being a second layer from a top;
    forming a side wall film on a side surface of the slit above the cover film;
    after removing the cover film or retreating the upper end while leaving the side wall film, removing the second film having a slit side end portion not covered with the side wall film and the cover film by etching through the slit, thereby forming an air gap in a portion from which the second film is removed; and
    forming a sealing film which closes an upper end of the slit while leaving the air gap.

10. The method according to claim 9, wherein
    the sealing film closes the upper end of the slit in a vicinity of an upper end of the side wall film, and
    the air gap is connected to an internal space of the slit closed by the sealing film.

11. The method according to claim 9, wherein
    after forming the side wall film, the upper end of the cover film is retreated while at least a slit side end portion of the second film between a lowermost first film and the first film being a second layer from a bottom is covered with the cover film, and the second film between the lowermost first film and the first film being the second layer from the bottom is left without being removed.

12. A method for manufacturing a semiconductor device, comprising:
    forming a stacked body above a foundation layer, the stacked body including a plurality of first films and a plurality of second films, the first films and the second films including a first film and a second film stacked alternately;
    forming a slit which divides the stacked body into a plurality of blocks;
    forming a cover film on a bottom of the slit to a height so as to cover at least a lateral side of a lowermost second film on the foundation layer; and
    removing the second film positioned above an upper end of the cover film of the second films by etching through the slit after forming the cover film, thereby forming an air gap in a portion from which the second film is removed.

13. The method according to claim 12, wherein the cover film covers a lateral side of the second films on a lower layer side including the lowermost second film, and the second films on the lower layer side are left without being removed.

14. The method according to claim 12, further comprising:
    forming an insulating film which closes a slit side end portion of the air gap; and
    forming an upper-side select gate layer above the stacked body after forming the insulating film.

15. The method according to claim 12, further comprising replacing the first film with an electrode layer through the slit before forming the cover film.

16. The method according to claim 15, further comprising forming a cap film which covers a slit side end portion of the electrode layer before forming the cover film.

* * * * *